United States Patent
Mitsuishi

(10) Patent No.: US 7,822,168 B2
(45) Date of Patent: Oct. 26, 2010

(54) FREQUENCY DIVIDER CIRCUIT

(75) Inventor: Masafumi Mitsuishi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 59 days.

(21) Appl. No.: 12/379,465

(22) Filed: Feb. 23, 2009

(65) Prior Publication Data

US 2009/0212833 A1  Aug. 27, 2009

(30) Foreign Application Priority Data

Feb. 25, 2008 (JP) ............................. 2008-043132

(51) Int. Cl.
  *H03K 21/00* (2006.01)
(52) U.S. Cl. .......................................... 377/47; 377/48
(58) Field of Classification Search ................ None
See application file for complete search history.

(56) References Cited

U.S. PATENT DOCUMENTS

| | | | | |
|---|---|---|---|---|
| 5,020,082 | A * | 5/1991 | Takeda | 377/44 |
| 5,349,622 | A * | 9/1994 | Gorisse | 377/52 |
| 5,948,046 | A * | 9/1999 | Hagberg | 708/103 |
| 6,760,397 | B2 * | 7/2004 | Wu et al. | 377/47 |
| 7,233,181 | B2 | 6/2007 | Osako | |
| 2007/0147571 | A1 * | 6/2007 | Yu et al. | 377/47 |

FOREIGN PATENT DOCUMENTS

| | | |
|---|---|---|
| JP | 2003-124808 | 4/2003 |
| JP | 2004-56717 | 2/2004 |
| JP | 2006-54806 | 2/2006 |

* cited by examiner

*Primary Examiner*—Tuan Lam
(74) *Attorney, Agent, or Firm*—McGinn IP Law Group, PLLC

(57) ABSTRACT

Disclosed is a frequency divider including first to fifth FFs (flip-flops), each of which receives a common clock signal and samples and outputs an input signal responsive to an effective edge of the clock, an output signal of the 1st FF being supplied to the 2nd FF, a first logic gate which receives an output signal of the 2nd FF and a first control signal and outputs the output signal of the 2nd FF, when the first control signal is of a first value, and outputs a predetermined value, when the first control signal is of a second value, the output signal of the first logic gate being supplied to an input of the 3rd FF; a second logic gate which receives an output signal of the 1st FF and a second control signal and outputs an output signal of the 1st FF, when the second control signal is of the first value and outputs the predetermined value, when the second control signal is of the second value, the output signal of the second logic gate being supplied to the 4th FF; and a third logic gate which receives an output signal of the 3rd FF and an output signal of the 4th FF and outputs an output signal of a first value, when both inputs thereof are of a second value, the output signal of the third logic gate being supplied to an input of the 5th FF, an output signal of the 5th FF being fed back to an input of the 1st FF.

12 Claims, 16 Drawing Sheets

FIG.11

| DIVN | | | | | |
|---|---|---|---|---|---|
| S67 | S78 | N625 | N75 | Mode | |
| 1 | 0 | clock | x | div-6.25 | |
| 0 | 1 | x | clock | div-7.5 | |
| 1 | 1 | x | x | x | |
| 0 | 0 | x | x | x | |

FREQUENCY DIVIDER CIRCUIT

REFERENCE TO RELATED APPLICATION

This application is based upon and claims the benefit of the priority of Japanese patent application No. 2008-043132, filed on Feb. 25, 2008, the disclosure of which is incorporated herein in its entirety by reference thereto.

TECHNICAL FIELD

This invention relates to a frequency divider circuit.

BACKGROUND

FIG. 15 shows a configuration of a fractional frequency divider circuit disclosed in Patent Document 1, by way of giving a typical relevant technique of a frequency divider circuit with a frequency division number (frequency division ratio) including a number composed of an integer part and a subdecimal part (fractional number). Referring to FIG. 15, the circuit includes a PLL (phase locked loop) circuit 14 comprising a voltage controlled oscillator (VCO) 13, and a plurality of frequency divider circuits 15a to 15i. The VCO 13 outputs, from its four terminals, four oscillation frequencies, obtained on equal phase division of a period of the oscillation frequency fvco of an output clock signal. The frequency divider circuits 15a to 15i generate respective frequency divided output signals in 0.5 units, using clock signals of the four oscillation frequencies. FIG. 16 depicts a diagram showing a circuit configuration of a divide-by-1.5 frequency divider circuit disclosed in Patent Document 1. Referring to FIG. 16, the divide-by-1.5 frequency divider 15b includes a frequency divider 21, connected to the VCO 13 of the PLL circuit 14, a shift register 22 and a decoder 23. Clock signals CP1 to CP4, output from the VCO 13, are delivered as inputs to the divide-by-1.5 frequency divider 15b, and a 1.5-divided frequency division clock signal is delivered as an output. The frequency divider 21 includes two D-flip-flops DFF1 and DFF2, connected in cascade, and a NOR 1 that delivers a NOR output from the outputs of the d-flip-flops DFF1 and DFF2. A data terminal D of DFF1 receives an output of the NOR1 that receives data outputs Q of DFF1 and DFF2. An output signal of the frequency divider 21 is delivered from DFF 2. The shift register 22 includes four D-flip-flops DFF3 to DFF6 which receive the clock signals CP1 to CP4, respectively. The output of the frequency divider 21 is delivered to the initial stage D-flip-flop DFF 3 and output signals A to D are taken out from the outputs of the D-flip-flops DFF3 to DFF6, respectively. A NAND circuit NAND1 in the decoder 23 receives the signal A and a signal obtained by inverting the signal B by an inverter INV1. A NAND circuit NAND 2 receives the signal C and a signal obtained by inverting the signal D by an inverter INV 2. The 1.5-divided frequency division clock signal is taken out from a NAND circuit NAND 3 that receives output signals of the NAND circuits NAND1 and NAND2.

As a technique relevant to the frequency divider circuit, in which it is possible to switch between different integer frequency division numbers, Patent Document 2, for example, discloses a configuration in which the frequency division number may be selected from among 8, 9, 10, 16, 17 and 18 by control signals M1, M2 and M3. On the other hand, Patent Document 3 discloses a configuration of a multi-modulus p/p+1/p+2/p+4 prescaler that uses a p/p+1 dual modulus counter.

[Patent Document 1]
   JP Patent Kokai Publication No. JP2004-56717A

[Patent Document 2]
   JP Patent Kokai Publication No. JP2006-54806A

[Patent Document 3]
   JP Patent Kokai Publication No. JP2003-124808A

SUMMARY

The following is an analysis of the related techniques from the side of the present invention.

The configurations shown in FIGS. 15 and 16 include redundant circuits to cope with multiple frequency division numbers, and are large in circuit size. Moreover, the fractional frequency division is premised on the use of multi-phase clocks. Thus, to get a desired frequency division number, the circuit size is increased even in case a spurious-free configuration, that is, a configuration not containing spurious components in the frequency divided output, is not used.

Moreover, the configurations disclosed in the Patent Documents 2 and 3 relate to a frequency divider circuit having an integer number as the frequency division number and hence totally different from the present invention which will now be described.

The invention disclosed in the present application may be summarized substantially as follows:

The frequency divider circuit according to the present invention includes first to fifth flip-flops. The second flip-flop receives an output of the first flip-flop. The second flip-flop receives an output of the first flip-flop. The third flip-flop receives an output of the second flip-flop via a first logic gate that is turned on for the divide-by-seven frequency division mode or the divide-by-eight frequency division mode. The fourth flip-flop receives an output of the second flip-flop via a second logic gate that is turned on for the divide-by-six frequency division mode or the divide-by-seven frequency division mode. The fifth flip-flop receives an output of a third logic gate that receives an output of the third flip-flop and an output of the fourth flip-flop as inputs. An output of the fifth flip-flop is fed back to an input of the first flip-flop.

In more detail, a frequency divider circuit in one aspect of the present invention comprises first to fifth flip-flops having a clock signal as common inputs. The first to fifth flip-flops each sample and output an input signal in response to a predetermined one, termed an effective edge, of a rising edge and a falling edge of the clock signal. An output signal of the first flip-flop is delivered to the second flip-flop. The frequency divider circuit also includes a first logic gate that receives an output signal of the second flip-flop and a first control signal. The first logic gate outputs an output signal of the second flip-flop in case the first control signal is of a first value, while outputting a predetermined value in case the first control signal is of a second value. The frequency divider circuit also includes a second logic gate that receives an output signal of the first flip-flop and a second control signal. The second logic gate outputs an output signal of the first flip-flop in case the second control signal is of the first value, while outputting a predetermined value in case the second control signal is of the second value. The third flip-flop receives an output signal of the first logic gate, while the fourth flip-flop receives an output signal of the second logic gate. The frequency divider circuit also includes a third logic gate that receives an output signal of the third flip-flop and an output signal of the fourth flip-flop and that outputs the first value when both inputs are of the second value. The fifth flip-flop receives an output signal of the third logic gate. An output signal of the fifth flip-flop is fed back to an input of the first flip-flop. According to the present invention, the fifth flip-flop outputs an eight-divided frequency division signal when the first control signal is of the first value and the second control signal is of the second value. From an output terminal of the fifth flip-flop, an eight-divided frequency division signal is output when the first control signal is of the first value and the second control signal is of the second value, a seven-divided frequency division signal is output when the first control signal is of the first value and the second control signal is of the first value, and a six-divided frequency division signal is output when the first control signal is of the second value and the second control signal is of the first value.

A frequency divider circuit in another aspect of the present invention comprises the above frequency divider circuit and a switching circuit. An output or an inverted output of the fifth flip-flop is a frequency divided output. The switching circuit receives third and fourth control signals for setting a frequency division number and that also receives an output signal of the fifth flip-flop and an inversion of an output signal of the third flip-flop as the first and second timing signals, respectively. The switching circuit generates the first and second control signals based on the first and second timing signals and the third and fourth control signals to deliver the first and second control signals generated to the frequency divider circuit. The switching circuit generates, as the first control signal, a signal the frequency of which is divided from the first timing signal with a frequency division number of four when the third and fourth control signals are of the first and second values, respectively. The switching circuit generates, as the second control signal, a signal the frequency of which is divided from the second timing signal with a frequency division number of two when the third and fourth control signals are of the second and first values, respectively. A plurality of 6-divided frequency division signals and a 7-divided frequency division signal are time-divisionally output at a rate of three 6-divided frequency division signals and a sole 7-divided frequency division signal to output a 6.25-divided frequency division signal on an average when the third and fourth signals are of the first and second values, respectively. A 7-divided frequency division signal and an 8-divided frequency division signal are time-divisionally output at a rate of one 7-divided frequency division signal and one 8-divided frequency division signal to output a 7.5-divided frequency division signal on an average when the third and fourth signals are of the second and first values, respectively.

According to the present invention, the switching circuit includes sixth and seventh flip-flops that receive the first timing signal as a clock input and that sample the input signal responsive to an effective edge of the clock input to output the sampled signal. The seventh flip-flop receives an output signal of the sixth flip-flop. An inversion of an output of the seventh flip-flop is fed back to the sixth flip-flop. The switching circuit also includes a fourth logic gate that receives outputs of the sixth and seventh flip-flops as two inputs. The fourth logic gate outputs the second value when the two inputs are both of the first value. The switching circuit also includes a fifth logic gate that receives the third control signal and an output signal of the fourth logic gate as two inputs and outputs the second value when both of the two inputs are of the first value. An output signal of the fifth logic gate is the first control signal. The switching circuit also includes an eighth flip-flop that receives the second timing signal as a clock input and that samples an inverted signal of the output responsive to an effective edge of the clock input. The second timing signal is an inversion of an output of the third flip-flop of the frequency divider circuit. The switching circuit further includes a sixth logic gate that receives the fourth control signal and an output signal of the eighth flip-flop as two inputs and that outputs the second value when both of the two inputs are of the first value.

According to the present invention, a first phase clock, a second phase clock, a third phase clock and a fourth phase clock may be received as inputs. The frequency divider circuit may receive the first phase clock as input and deliver an inverted signal of the output of the fifth flip-flop as a first output signal. The frequency divider circuit may comprise a first shift circuit that receives the second phase clock as an input clock and that outputs a second output signal delayed from the first output signal by a first number of clock cycles of the second phase clock. The frequency divider circuit may also comprise a second shift circuit that receives the third phase clock as an input clock and that outputs a third output signal delayed from the second output signal by a second number of clock cycles of the third phase clock and a fourth output signal delayed from the second output signal by the first number of clock cycles of the third phase clock. The frequency divider circuit may also comprise a third shift circuit that receives the fourth phase clock as an input clock and that outputs a fifth output signal delayed from the fourth output signal by the first number of clock cycles of the fourth phase clock. The frequency divider circuit may also comprise a logic circuit that receives the first, second, fourth and fifth output signals and that outputs a result of a logical operation on the first, second, fourth and fifth output signals as a 6.25-divided frequency division signal. The frequency divider circuit may also comprise a logic circuit that outputs a result of a logical operation on the first and third output signals as a 7.5-divided frequency division signal.

According to the present invention, the shift circuit may include an initial stage flip-flop that samples and outputs an input signal responsive to an effective edge of an inverted signal of the input clock and a plurality of stages of flip-flops each sampling and outputting an output of the previous stage flip-flop responsive to inversion of the input clock.

According to the present invention, the number of devices may be reduced to enable reduction in the circuit size and in power dissipation.

According to the present invention, the number of flip-flops of the frequency divider circuit as a core circuit may be reduced to reduce the number of indefinite states to enable self-restoration.

Moreover, according to the present invention, a self-restoration (reset-free) switching circuit for switching between divide-by-6, divide-by-7 and divide-by-8 frequency divider circuits without additional circuits. This enables a divide-by-6.25 or divide-by-divide-by-7.5 frequency divider circuits by a simplified switching circuit.

Further, according to the present invention, a spurious-free divide-by-6.25 circuit or a divide-by-7.5 frequency divider circuit may be implemented with the use of multi-phase clocks. The circuits thus implemented may again be a self-restoration circuit, that is, a reset-free circuit.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 11 is a diagram showing operating modes of the shift circuit of FIG. 9.

PREFERRED MODES OF THE INVENTION

Reference is now made to the accompanying drawings for more detailed illustration of the present invention. In one aspect of the present invention, there are provided first to fifth edge-triggered flip-flops, abbreviated below to FFs (101 to 105), as shown in FIG. 1. The second FF (102) receives an output of the first FF (101). The third FF (103) receives an output of the second FF (102) via a logic gate (106) that is turned on when the first control signal (D67) is of a first value for the divide-by-seven frequency division mode or the divide-by-eight frequency division mode. The fourth FF (104) receives an output of the first FF (101) via a logic gate (107) that is turned on when a second control signal (D78) is of a first value for the divide-by-six mode or the divide-by-seven mode. The fifth FF (105) receives a result of logical operations of a logic gate (108) that receives an output of the third FF (103) and an output of the fourth FF (104) as inputs. An output of the fifth FF (105) is fed back to the input of the first FF (101).

The frequency divider circuit operates as a divide-by-eight frequency divider when the first control signal (D67) is of a first value and the second control signal (D78) is of a second value. The frequency divider circuit also operates as a divide-by-seven frequency divider when the first control signal (D67) and the second control signal (D78) are both of a first value, while operating as a divide-by-six frequency divider when the first control signal (D67) is of a second value and the second control signal (D78) is of a first value.

With the frequency divider circuit according to the present invention, having five FFs and three gate circuits, it is possible to switch among frequency division with frequency division number of 6, that with frequency division number of 7 and that with frequency division number of 8. With the frequency divider circuit according to the present invention, it is unnecessary to provide a terminal (a set terminal or a reset terminal) that sets or resets the FFs to preset known states. The frequency divider circuit according to the present invention may serve as a core circuit for implementing the fractional frequency division and the spurious-free and fractional frequency division.

Figure 3:
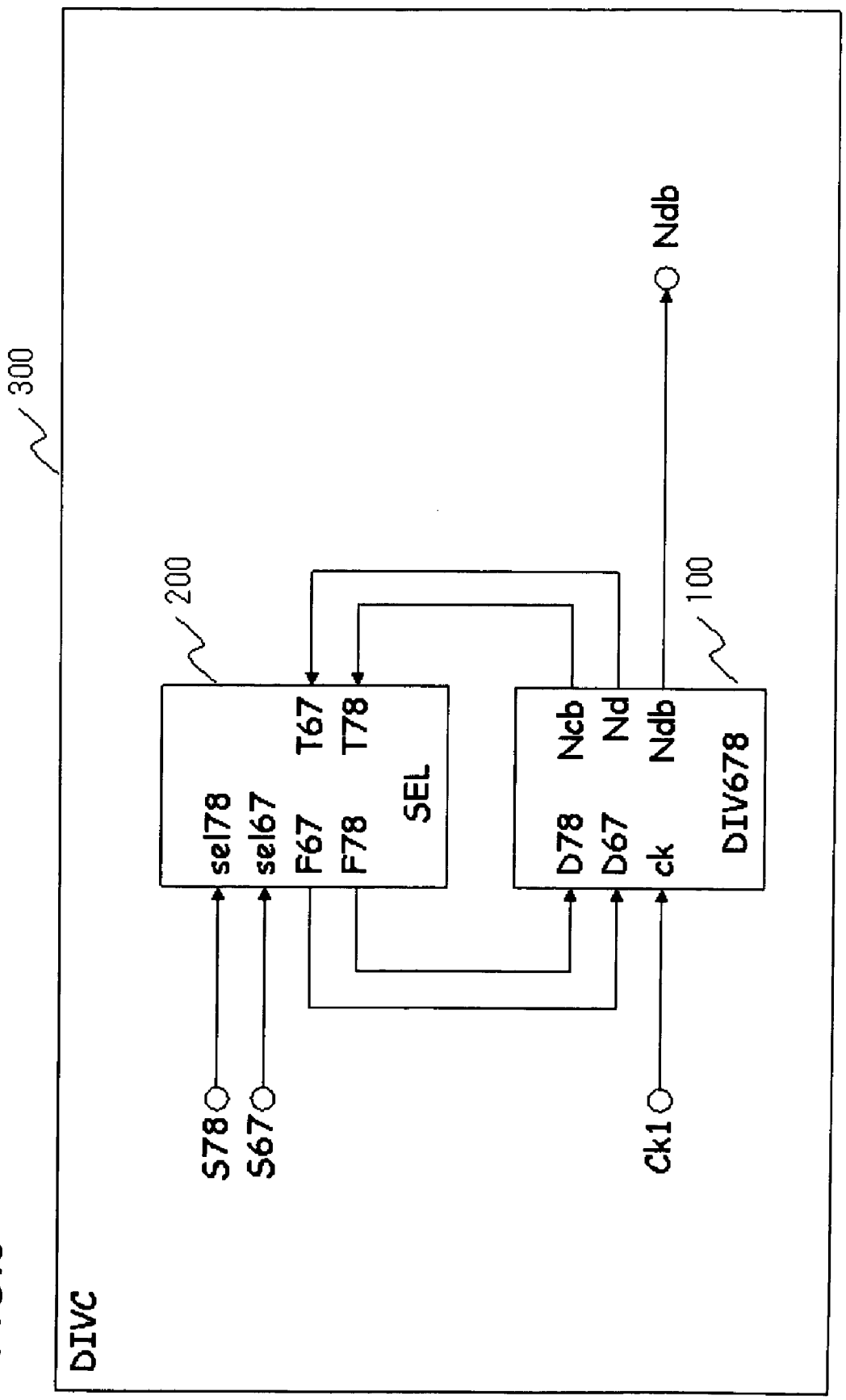
FIG. 3 is a diagram showing a circuit configuration of a second exemplary embodiment of the present invention.

In accordance with the frequency divider circuit of the second exemplary embodiment of the present invention, there are provided a switching circuit (200) that receives an output of a frequency divider circuit (100) and that exercises time-divisional switching control between p times of divide-by-six frequency division and q times of divide-by-seven frequency division, as shown in FIG. 3. The frequency divider circuit (100) delivers a frequency divided output with the frequency division number equal to (6×p+7×q)/(p+q). For p=3 and q=1, a 6.25-divided output is obtained. The switching circuit (200) is responsive to an output of the frequency divider circuit (100) to exercise time-divisional switching control between r times of divide-by-seven frequency division and s times of divide-by-eight frequency division. The frequency divider circuit (100) delivers a frequency divided output with the frequency division number equal to (7×r+8×s)/(r+s). For r=1 and s=1, for example, a 7.5-divided output is obtained. According to the present invention, it is unnecessary to reset the FFs of the 6/7/8 frequency divider circuits. That is, no reset terminals or reset signal lines for FFs are needed. According to the present invention, a fractional frequency division number as frequency division number may be implemented by time-divisionally switching between frequency division with a frequency division number equal to an integer and that with another frequency division number equal to another integer.

According to the present invention, the switching circuit (200) receives third and fourth control signals (se167 and se178) for setting the frequency division number. The switching circuit (200) also receives an output signal (Nd) of the fifth FF (105) and an inverted signal (Ncb) of an output signal of the third FF (103), as first and second timing signals (T67, T78), respectively. The switching circuit generates first and second control signals (D67, D78) which are then supplied to the frequency divider circuit (100). The switching circuit (200) generates a signal the frequency of which is divided from the first timing signal (T67) with a frequency division number of four as the first control signal (D67) when the third and fourth control signals (se167, se178) are of the first and second values, respectively. The switching circuit (200) generates a signal the frequency of which is divided from the second timing signal (T78) with a frequency division number of two, as the second control signal (D78) when the third and fourth control signals (se167, se178) are of the second and first values, respectively. A plurality of 6-divided frequency division signals and a 7-divided frequency division signal are time-divisionally output at a rate of three 6-divided frequency division signals and a sole 7-divided frequency division signal so that a 6.25-divided frequency division signal on an average is output from the frequency divider circuit (100)

when the third and fourth signals (se167, se178) are of the first and second values, respectively. A 7-divided frequency division signals and an 8-divided frequency division signal are time-divisionally output at a rate of one 7-divided frequency division signals and one 8-divided frequency division signal so that a 7.5-divided frequency division signal on an average is output from the frequency divider circuit (100) when the third and fourth signals (se167, se178) are of the second and first values, respectively.

Figure 9:
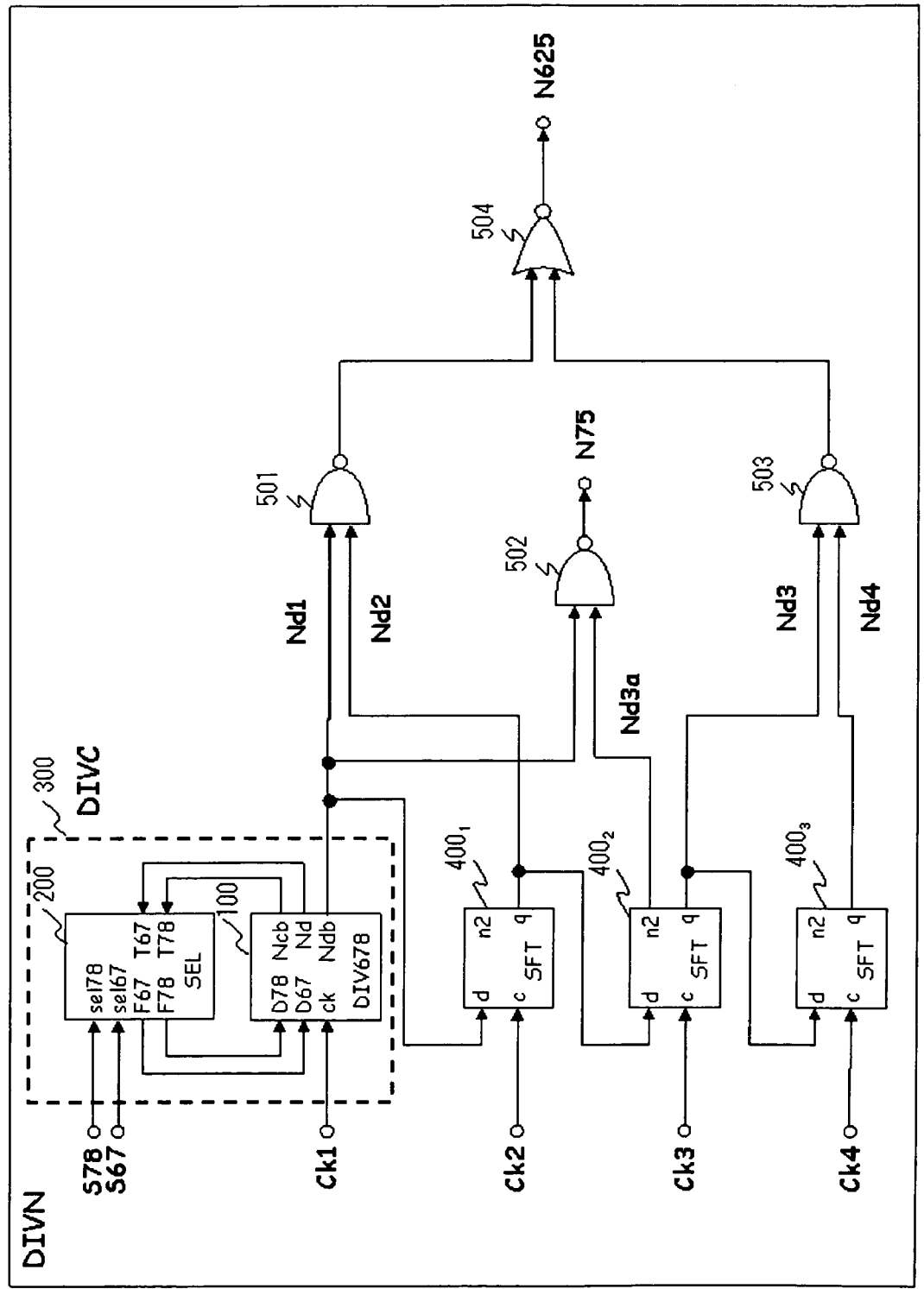
FIG. 9 is a diagram showing a third exemplary embodiment of the present invention.

In a third exemplary embodiment of the present invention, there are provided the frequency divider circuit (100) and the switching circuit (200), as shown in FIG. 9. Four-phase clocks which have respective phases shifted by 90 degrees from one another, are used, and the frequency divider circuit (100) is driven with the first phase clock. A first shift circuit ($400_1$) receives a divided output signal (Nd1) of the frequency divider circuit (100) and is driven by a second phase clock to output the signal (Nd1) after a delay of a preset number of clock cycles. A first logic circuit (501) outputs a result of a logical operation on the divided output signal (Nd1) of the frequency divider circuit (100) and the output signal (Nd2) of the first shift circuit ($400_1$), and a second shift circuit ($400_2$) receives an output signal (Nd2) of the first shift circuit ($400_1$) and is driven by the third phase clock signal. A second logic circuit (502) outputs, as a 7.5-divided frequency division clock signal, a result of a logical operation on the divided output signal (Nd1) of the frequency divider circuit (100) and a signal (Nd3a) corresponding to the divided frequency division output signal (Nd1) of the frequency divider circuit (100) delayed by a preset number of clock cycles, for example, 7.5 clock cycles, by the first shift circuit ($400_1$) and the second shift circuit ($400_2$). A third shift circuit ($400_3$) receives a divided output signal (Nd3) of the third shift circuit ($400_3$) and is driven by the fourth phase clock to output the signal (Nd3) after a delay of a preset number of clock cycles. A third logic circuit (503) takes a result of a logical operation on the output signal (Nd3) of the second shift circuit ($400_2$) and the output signal (Nd4) of the third shift circuit ($400_3$). A fourth logic circuit (504) outputs a result of a logical operation on the outputs of the first and third logic circuits.

With the second exemplary embodiment of the present invention, in which the frequency division with an integer frequency division number is switched to that with another integer frequency division number and vice versa to implement frequency division with the frequency division number equal to a fractional number. Thus, its frequency characteristic is not free from spurious components. With the third exemplary embodiment, a spurious-free 7.5-divided frequency division signal is output from the second logic circuit (502), whilst spurious-free 6.25-divided frequency division signal is output from the fourth logic circuit (504). The present invention is now described with reference to its Examples.

Figures 1A, 1B:
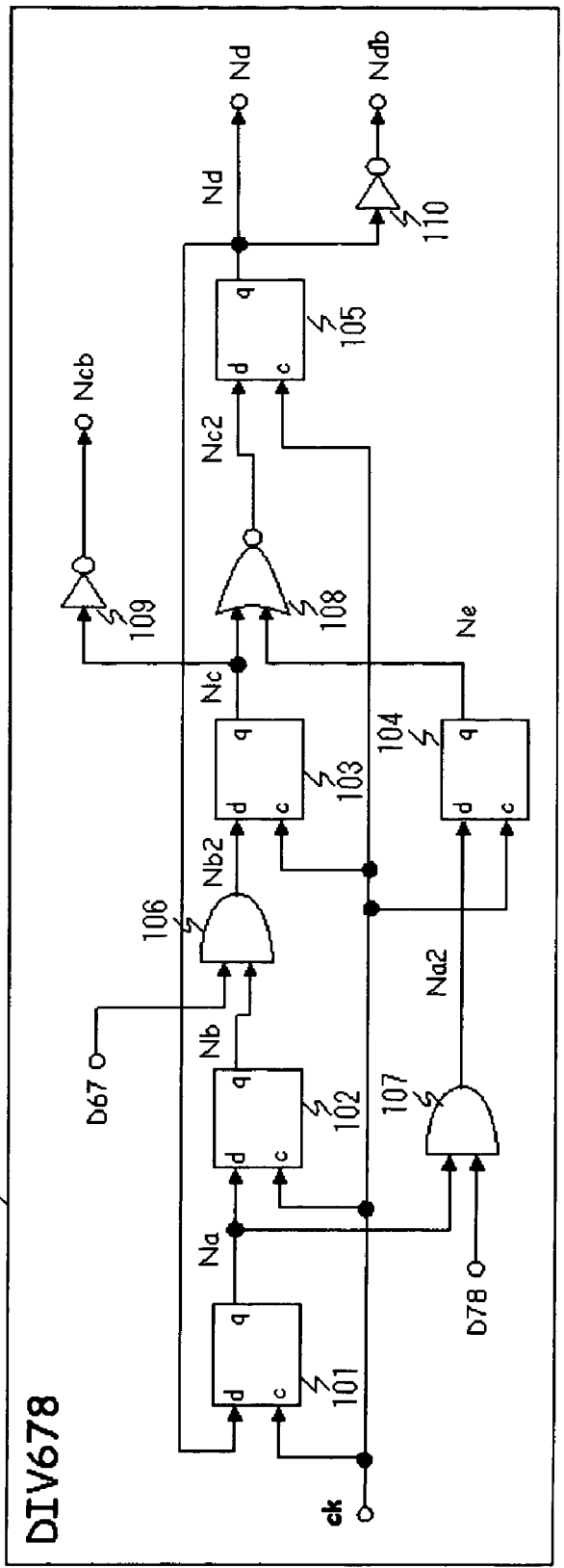
FIG. 1A is a diagram showing a circuit configuration of an exemplary embodiment of the present invention.
FIG. 1B is a diagram showing operating modes of an exemplary embodiment of the present invention.

FIG. 1A is a diagram showing a circuit configuration of a frequency divider circuit 100 of an Example of the present invention. In this frequency divider circuit 100, one of 6, 7 and 8 is selected as a frequency division number by input control signals D67 and D78. In the present specification, the frequency divider circuit 100 is also referred to as 'DIV678'.

Referring to FIG. 1, the frequency divider circuit 100 includes flip-flops (sometimes abbreviated to FFs) 101 to 105, each of which samples a signal at a data input terminal d with a rising edge of a clock c to output a sampled signal at a data output terminal q. The frequency divider circuit also includes two-input AND gates 106 and 107, a two-input NOR gate 108 and inverters 109 and 110.

A clock signal ck is supplied in common to the clock terminals c of the flip-flops FF 101 to FF 105.

A data output signal of FF 105 is fed back to the data input terminal d of FF 101. The data output terminal q of FF 101 is connected to the data input terminal d of FF 102, while being connected to one of input terminals of the AND gate 107.

The AND gate 107 takes an AND operation of the control signal D78 and an output signal of FF 101, and has its output terminal connected to the data input terminal d of FF104.

The data output terminal q of FF 102 is connected to one of input terminals of the AND gate 106.

The AND gate 106 takes an AND operation of the control signal D67 and an output signal of FF 102, and has its output terminal connected to the data input terminal d of FF103.

The data output terminal q of FF 103 and the data output terminal q of FF 104 are connected to two input terminals of the NOR gate 108. An output terminal of the NOR gate 108 is connected to the input terminal d of FF 105.

The data output terminal d of FF 105 is connected to a terminal Nd. An output of FF105 is fed back to a terminal Nbd via the inverter 110. As aforementioned, the terminal Nd is connected to the data input terminal d of FF 101.

An output Nc of FF 103 is inverted by the inverter 109 and the inverted signal is output at a terminal Ncb.

FIG. 1B illustrates the values of the control signals D67 and D78, a node Ndb and the frequency division mode. Referring to FIG. 1A, if the control signals D67 and D78 are both 1, respectively, the frequency is divided by 7.

If the control signals D67 and D78 are 1 and 0, respectively, the frequency is divided by 8 and, if the control signals D67 and D78 are 0 and 1, respectively, the frequency is divided by 6.

If the control signals D67 and D78 are both 0, the circuit is reset. It is noted that logical values 1 and 0 correspond to High and Low of the logical level, respectively.

Figures 2A, 2B:
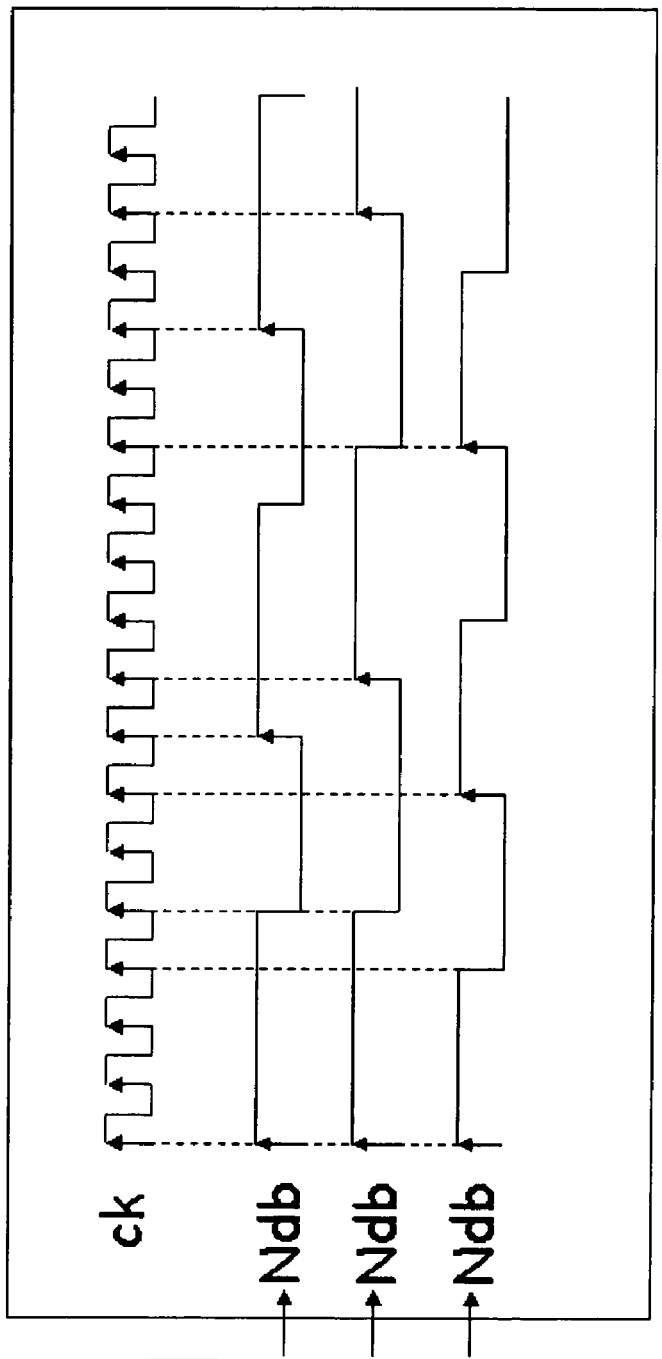
FIG. 2A is again a diagram showing operating modes of an exemplary embodiment of the present invention.
FIG. 2B is a waveform diagram showing timing waveforms of an exemplary embodiment of the present invention.

FIGS. 2A and 2B show the values of the control signals D67 and D78 in FIG. 1A and a signal waveform of Ndb. If, in FIG. 1A, D67=0 and D78=1, a signal is transmitted as follows:

FF 101→AND gate 107→FF 104→NOR gate 108→FF105 and fed back to FF 101. Since an output of FF 103 is fixed at 0 (Low) and the other input Nc of the NOR gate 108 is also fixed at 0 (Low), the NOR gate 108 outputs a signal Nc2 inverted from an output of FF 104 (Ne).

It is assumed that, at a clock cycle to, the values of FF101, FF104 and FF105 are all 0. The values of nodes Na, Na2, Ne, Nc2, Nd and Ndb at clock cycles from t0 are as follows:

Ck[Na,Na2,Ne,Nc2,Nd,Ndb]

t0:[0,0,0,1,0,1]

t1:[0,0,0,1,1,0]

t2:[1,1,0,1,1,0]

t3:[1,1,1,0,1,0]

t4:[1,1,1,0,0,1]

t5:[0,0,1,0,0,1]

t6:[0,0,0,1,0,1]

t7:[0,0,0,1,1,0]     (1)

That is, the terminal Nd (Ndb) outputs a 6-divided frequency division clock signal, with a cycle of the clock signal being made up of six clock cycles (t1 to t6). These six clock cycles are three consecutive clock cycles 0 followed by three consecutive clock cycles 1.

With D67=1 and D78=0, a signal is transmitted as follows: FF 101→FF 102→FF 103→FF 105 and fed back to FF 101. An output of FF 104 is fixed at 0 (Low). Since the input Ne to the NOR gate 108 is fixed at 0 (Low), the NOR gate 108 outputs a signal inverted from the output (Nc) of FF 103 to the node Nc2.

It is assumed that, at the clock cycle t0, the values of FF 101, FF 105 and FF 104 are all 1. The values of nodes Na, Na2, Ne, Nc2, Nd and Ndb at clock cycles from t0 are as follows:

Ck:[Na,Nb,Nb2,Nc,Nc2,Nd,Ndb]

t0:[0,0,0,0,1,0,1]

t1:[0,0,0,0,1,1,0]

t2:[1,0,0,0,1,1,0]

t3:[1,1,1,0,1,1,0]

t4:[1,1,1,1,0,1,0]

t5:[1,1,1,1,0,0,1]

t6:[0,1,1,1,0,0,1]

t7:[0,0,0,1,0,0,1]

t8:[0,0,0,0,1,0,1]

t9:[0,0,0,0,1,1,0]  (2)

The terminal Nd (Ndb) outputs an 8-divided frequency division clock signal, with a cycle of the clock signal being made up of eight clock cycles (t1 to t8). These eight clock cycles are four consecutive clock cycles 0 followed by four consecutive clock cycles 1.

With D67=1 and D78=1, a signal is transmitted as follows: FF 101→FF 102→AND gate 106→thence to FF 103, and delivered via the NOR gate 108 to the FF 105. A signal is also transmitted from FF 101 to the AND gate 107, thence to FF 104, and delivered via the NOR gate 108 to the FF 105. These two signals are fed back to the FF 101. It is assumed that, at the clock cycle t0, the values of FF 101 to FF 105 are all 0. The values of nodes Na, Nb, Nb2, Nc, Na2, Ne, Nc2, Nd and Ndb at clock cycles from t0 are as follows:

Ck:[Na,Nb,Nb2,Nc,Na2,Ne,Nc2,Nd,Ndb]

t0:[0,0,0,0,0,0,1,0,1]

t1:[0,0,0,0,0,0,1,1,0]

t2:[1,0,0,0,1,0,1,1,0]

t3:[1,1,1,0,1,1,0,1,0]

t4:[1,1,1,1,1,1,0,0,1]

t5:[0,1,1,1,0,1,0,0,1]

t6:[0,0,0,1,0,0,0,0,1]

t7:[0,0,0,0,0,0,1,0,1]

t8:[0,0,0,0,0,0,1,1,0]

t9:[1,0,0,0,1,0,1,1,0]

t10:[1,1,1,0,1,1,0,1,0]

t11:[1,1,1,1,1,1,0,0,1]  (3)

The terminal Ndb outputs a 7-divided frequency division clock signal with a cycle of the clock signal being made up of seven clock cycles of Ck (such as t1 to t7). These seven clock cycles are four consecutive clock cycles 1 followed by three consecutive clock cycles 0.

With D67=0 and D78=0, the outputs Nb2 and Na2 of the AND gates 106, 107 are fixed at 0 (Low). If, in the initial state, FF 101 to FF 105 are 1, the operation of the circuit becomes as follows:

Ck[Na,Nb,Nb2,Nc,Na2,Ne,Nc2,Nd,Ndb]

t0:[1,1,0,1,0,1,0,1,1]

t1:[1,1,0,0,0,0,1,0,0]

t2:[0,1,0,0,0,0,1,1,0]

t3:[1,1,0,0,0,0,1,1,0]

t4:[1,1,0,0,0,0,1,1,0]  (4)

With D67=0 and D78=0, Ndb is reset from 1 to 0 and fixed at 0. With the present Example, no terminals are needed to set or reset FF 101 to FF 105.

In FIG. 1, the signal Ncb, inverted from the output (Nc) of FF 103 by the inverter 109, and the signal Nd, inverted from the output (Nd) of FF 105 by the inverter 110, are used as timings for generation of signals for switching the frequency division numbers, and are delivered to a selector (FIG. 4) described subsequently.

Another Example of the present invention will now be described. FIG. 3 depicts a schematic circuit diagram for illustrating typical connection between the frequency divider circuit of FIG. 1 (DIV678) and a frequency division number switching circuit (SEL) 200.

The frequency division number switching circuit (SEL) 200 receives signals S78, and S67 from outside, while transmitting the signals D67 and D78 to the control terminals D67 and D78 of the frequency divider circuit (DIV678) 100. The frequency division number switching circuit (SEL) 200 also receives the output signals Ncb and Nd of the frequency divider circuit (DIV678) 100 at its terminals T78 and T67, respectively, for use as timing for generating the frequency division number switching signals. The frequency divider circuit (DIV678) 100 operates by the clock signal Ck to output from its output terminal Nbd a 6.25-divided frequency division clock signal or a 7.5-divided frequency division clock signal responsive to the signals S78 and S67 delivered to the frequency division number switching circuit (SEL) 200.

The frequency division number switching circuit (SEL) 200 causes the frequency divider circuit (DIV678) 100 to continue frequency division with the frequency division ratio of 6 three times in succession, then to perform frequency division with the frequency division ratio of 7 once, and then to continue frequency division again with the frequency division ratio of 6 three times in succession. This delivers a 6.25-divided frequency division clock. Or, the frequency division number switching circuit (SEL) 200 causes the frequency divider circuit (DIV678) 100 to alternately perform the frequency division with the frequency division ratio of 7 and the frequency division with the frequency division ratio of 8. This delivers a 7.5-divided frequency division clock. The frequency division number switching circuit (SEL) 200 generates timings for generating the signals D67 and D78 for switching the frequency division numbers in the frequency divider circuit (DIV678) 100, using the output signals Nd, Ncb of the frequency divider circuit (DIV678) 100.

Figure 4:
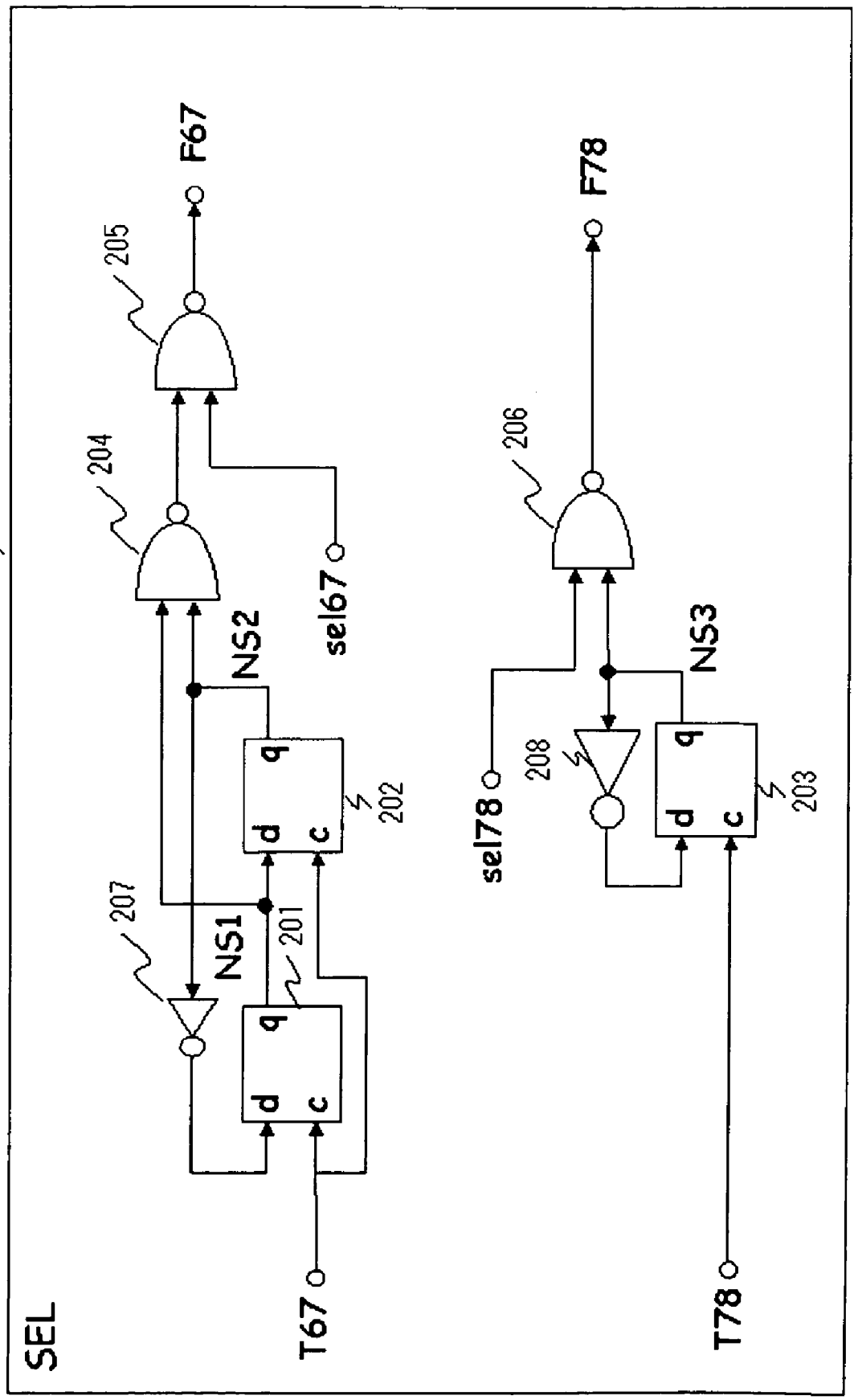
FIG. 4 is a diagram showing a circuit configuration of SEL of FIG. 3.

FIG. 4 depicts a circuit diagram showing a typical circuit configuration of the frequency division number switching circuit (SEL) 200 of FIG. 3. Referring to FIG. 4, the circuit includes flip-flops FF 201, FF 202 and FF 203, NAND gates 204, 205 and 206 and inverters 207 and 208.

A terminal T67 is connected to the terminal Ncb of the frequency divider circuit (DIV678) 100 of FIGS. 1A, 1B and 3, and a terminal T78 is connected to the terminal Nd of the circuit 100.

The FF 201 receives an output NS2 of FF202, inverted by the inverter 207, at its data input terminal d, and samples the signal with the rising edge of T67 as a sampling clock. The FF 202 receives an output NS1 of the FF 201 at its data input terminal d, and samples the signal with the rising edge of T67 as a sampling clock. The NAND gate 204 receives the output NS1 of the FF 201 and the output NS2 of the FF 202. The NAND gate 205 receives an output of the NAND gate 204 and the signal se167 to output a result of NAND operation as F67.

It is assumed that the output NS1 of the FF 201 and the output NS2 of the FF 202 are both 0 at a cycle t0 of the signal T67. Then, with the signal se167 of 1, the signals NS1, NS2, an output of the NAND gate 204 and an output of the NAND gate 205 are such that T67: [NS1, NS2, output of NAND 204, output of NAND 205]

t0:[0,0,1,0]

t1:[1,0,1,0]

t2:[1,1,0,1]

t3:[0,1,1,0]

t4:[0,0,1,0]

t5:[1,0,1,0]

t6:[1,1,0,1]    (5)

in response to the rising edge of the signal T67. The output F67 of the NAND gate 205 delivers a signal frequency-divided to one-fourth of the frequency of T67.

The FF 203 receives at its data input terminal d a signal corresponding to inversion of a signal NS3 of the FF 203 by the inverter 208 and samples the so received signal with a rising edge of the signal T78 as a sampling clock. The NAND gate 206 NANDs the output NS3 of the FF 203 and the signal se178 to output the result as F78. With the signal se178 of 1 (High), the terminal F78 outputs a signal frequency-divided from T78 with a frequency division number of two.

Figure 5:
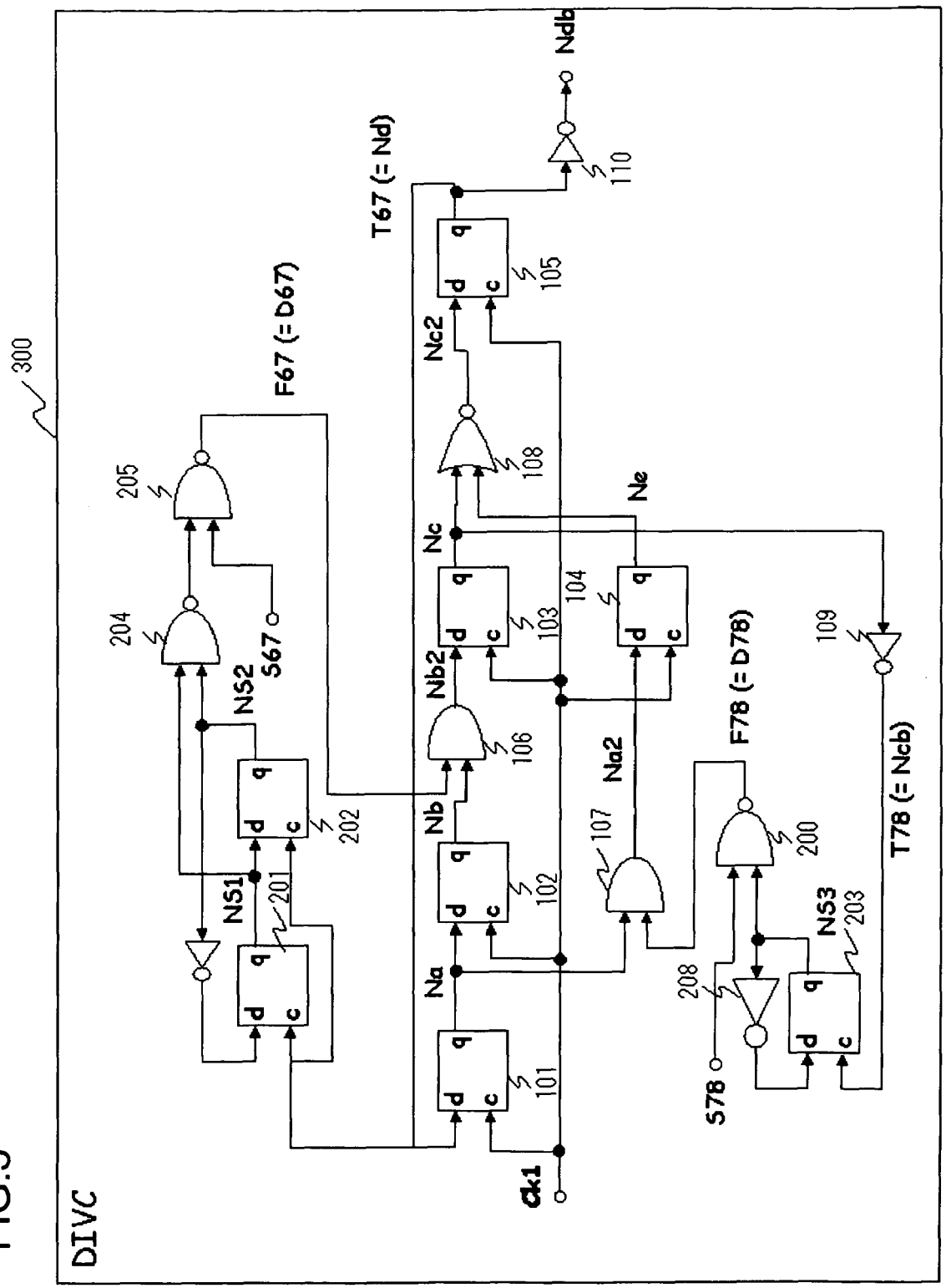
FIG. 5 is a diagram showing a circuit configuration of FIG. 3.

FIG. 5 depicts a detailed circuit diagram of the circuit of FIG. 3. More specifically, FIG. 5 shows the frequency divider circuit (DIV678) 100 and the frequency division number switching circuit (SEL) 200 of FIG. 3 redrawn to the configurations of FIGS. 1A, 1B and 4, respectively. The output F67 of the NAND gate 205 is delivered as D67 to the AND gate 106. Also, a signal corresponding to the output Nc of the FF 103 inverted by the inverter 109 is delivered as T78 to the FF 203.

Figure 6:
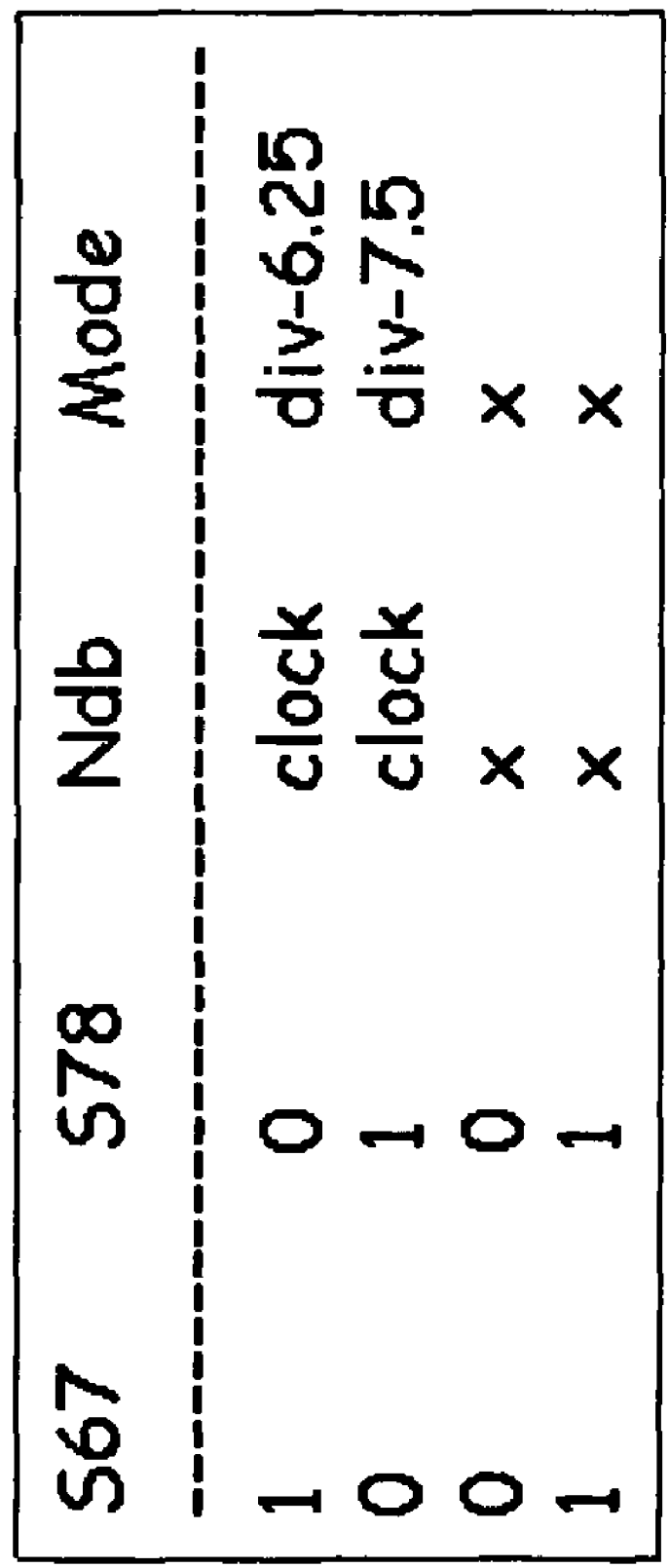
FIG. 6 is a diagram showing operating modes of FIG. 5.

FIG. 6 shows operating modes of the circuit of FIG. 5. A 6.25-divided frequency division signal and a 7.5-divided frequency division signal are output at the node Ndb subject to settings of S67 and S78. The divide-by-6.25 frequency division mode is for (S67, S78)=(1, 0), whilst the divide-by-7.5 frequency division mode is for (S67, S78)=(0, 1).

With the divide-by-6.25 frequency division mode, frequency division with the frequency division number of 6 and frequency division with the frequency division number of 7 are performed at a rate of three times for the frequency division with the frequency division number of 6 and once for the frequency division with the frequency division number of 7. The frequency division numbers are switched time-divisionally so that the frequency division number is (6×3+7)/4=25/4=6.25 in terms of a time-averaged number. With the divide-by-7.5 frequency division mode, frequency division is time-divisionally switched between the frequency division with the frequency division number of 6 which is carried out once and the frequency division with the frequency division number of 7 which is carried out once. Thus, the frequency division number is (7+8)/2=7.5 as a time-averaged number.

Referring to FIG. 6, with the divide-by-6.25 frequency division mode, in which S67=1 and S78=1, the output of the NAND gate 206 is fixed at 1 (High). The AND gate 107 transmits an output Na of the FF 101 to the data input terminal d of the FF 104. Since S67=1, the NAND gate 205 delivers an inverted value of an output of the NAND gate 204, that is, the result of the AND operation on NS1 and NS2, hence the result of the divide-by-four frequency division operation of T67 (=Nd), as F67 (D67), to one input terminal of the AND gate 106. That is, 1 is delivered as F67 (D67) to the AND gate 106 of the frequency divider circuit (DIV678) 100, at a period equal to one-fourth of the period of the signal T67, while 0 is delivered otherwise. If the input F67 to the AND gate 106 is 0, the frequency divider circuit (DIV678) 100 operates as a circuit for frequency division with the frequency division number of 6, with a signal then being transmitted from the FF 101 to the FF 104, thence to the FF 105 and thence back to the FF 101. If the input F67 to the AND gate 106 is 1, the frequency divider circuit (DIV678) 100 operates as a circuit for frequency division with the frequency division number of 7. In this case, a signal is transmitted from the FF 101 to the FF 102 and thence to the FF 103 to yield an output signal Nc. The signal is also transmitted from the FF 101 to the FF 104, which generates an output signal Ne. The signals Nc and Ne are NORed by the NOR gate 108, and the result of the NOR operation is delivered to the input terminal d of the FF 105 so as to be fed back to the FF 101.

Figure 7:
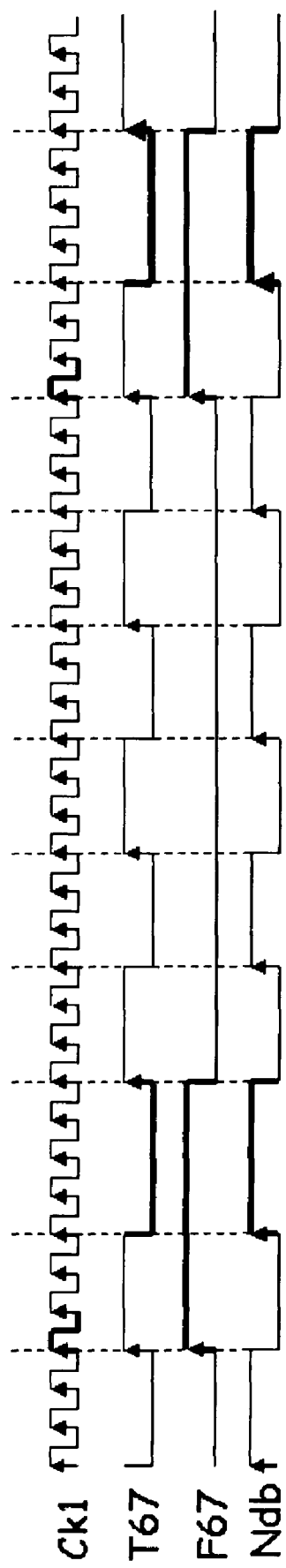
FIG. 7 is a waveform diagram showing timing waveforms of a mode div-6.25 in the circuit of FIG. 5.

FIG. 7 depicts a timing diagram showing the timing waveforms of Ck1, T67, F67 and Ndb of FIG. 5 in case of frequency division with the frequency division number of 6.25. The terminal F67 outputs a signal frequency-divided from T67 with the frequency division number equal to four. The signal T67 is a repetition of one frequency division cycle with the frequency division number of 7 and three consecutive frequency division cycles with the frequency division number of 6 as a fundamental cycle.

The operation of frequency division with the frequency division number of 7.5, shown in FIG. 5, is now described. With S67=0 and S78=1, the output of the NAND gate 205 of FIG. 5 is fixed at 1 (High). Since S78=1, the NAND 206 delivers an inverted value of the output NS3 of the FF 203 as F78 (D78) to the AND gate 107. The signal F78, delivered to the AND gate 107, is an alternation of 0s and 1s responsive to the rising edge of t78 (=Ncb, an inversion of Nc).

When the input F78 to the AND gate 107 is 1, the output Nc of a signal path from the FF 101 to the FF 103 via FF 102 and the output Ne of a signal path from the FF 101 through to the FF 104 are delivered to the NOR gate 108. The result of the operation at the NOR gate 108 is delivered to the data input terminal d of the FF 105 so as to be fed back to the FF 101. The frequency divider circuit then operates as a frequency divider circuit with the frequency division number of 7. When the input F78 to the AND gate 107 is 0, the output of the signal path from the FF 101 through the FF 102 and the FF 103 to the FF 104 is fed back to the FF 101, with the frequency divider circuit then operating for frequency division with the frequency division number of 8.

Figure 8:
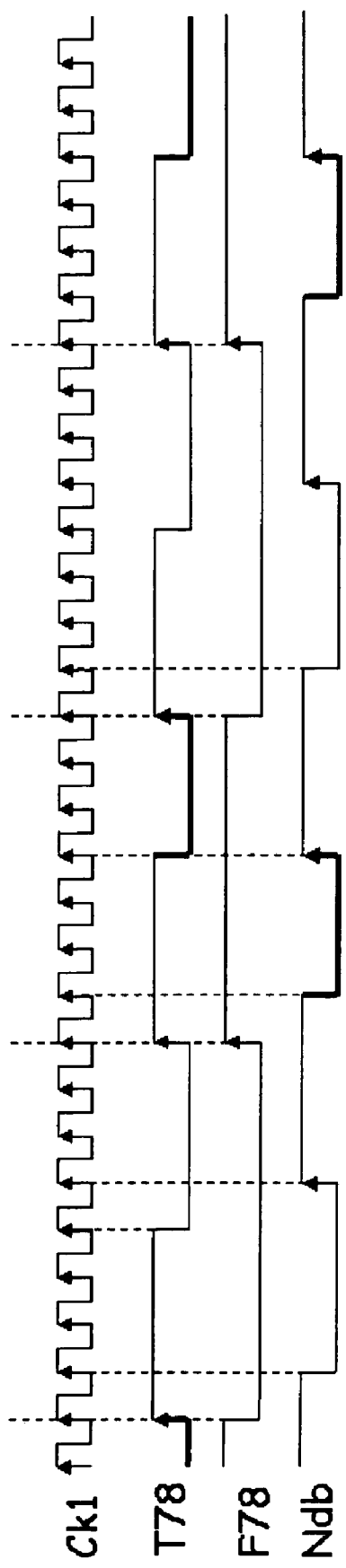
FIG. 8 is a waveform diagram showing timing waveforms of a mode div-7.5 in the circuit of FIG. 5.

FIG. 8 depicts a timing diagram showing timing waveforms of the signals Ck1, T78, F78 and Ndb of FIG. 5 for frequency division with the frequency division number of 7.5. The signal F78 is an alternate repetition of 0s and 1s responsive to the rising edge of T78 (=Ncb). On transition of the signal F78 from 1 (High) to 0 (Low), the terminal Ndb outputs a 7-divided frequency division clock signal from the clock cycle next following the transition timing. On transition of the signal F78 from 0 (Low) to 1 (High), the terminal Ndb outputs a 7-divided frequency division from the clock cycle next following the transition timing.

In the frequency division circuit (DIVC) 300 of the previous Example, described with reference to FIGS. 3 to 5, the frequency division number of the frequency divider circuit (DIV678) 100 is switched under control by the frequency division number switching circuit (SEL) 200. By so doing, a clock for frequency division with the frequency division number of a fractional number may be output from the frequency divider circuit (DIV678) 100. In this case, spurious components are contained in frequency spectral components of the clock for frequency division from the frequency divider circuit (DIV678) 100. In another Example of the present invention, described hereinbelow, such an configuration is described in which a clock for frequency division with the frequency division number of a fractional number, free from spurious components, is generated using the frequency divider circuit (DIVC) 300 explained with reference to FIGS. 3 to 5.

FIG. 9 shows the configuration of another Example of the present invention. Referring to FIG. 9, multi-phase clocks Ck1, Ck2, Ck3 and Ck4 which have phase-shifted from one another by 90 degrees, are provided for the circuit (DIVC) 300 already described with reference to FIGS. 3 to 5. The clock signal Ck1 is provided as a clock for the frequency divider circuit (DIV678) 100 of FIGS. 1A, 1B and 3. In the configuration of the present Examples there are provided a shift circuit (SFT) $400_1$ that receives an output Nd1 from the terminal Ndb of the frequency divider circuit (DIV678) 100 and that is driven by the clock signal Ck2. The configuration of the present Example also includes a shift circuit (SFT) $400_2$ that receives an output of the shift circuit $400_1$ and that is driven by the clock signal Ck3, and a shift circuit (SFT) $400_3$ that receives an output q of the shift circuit $400_2$ and the clock signal Ck4. The configuration of the present Example also includes a NAND gate 501 that receives an output Nd1 of the frequency divider circuit (DIV678) 100 and an output Nd2 of the shift circuit $400_1$, and an AND gate 502 that receives Nd1 and Nd3a which is an output of n2 of the shift circuit $400_2$. The configuration of the present Example further includes a NAND gate 503 that receives an output (Nd3) of the shift circuit $400_2$ and an output (Nd4) of the shift circuit $400_3$, and a NOR gate 504 that receives outputs of the NAND gates 501, 503.

The shift circuit $400_1$ outputs, from the terminal q, a signal Nd2 delayed from Ndb a preset number of clock cycles of Ck2, delayed 90 degrees from Ck1, from the terminal q. The preset number of clock cycles of Ck2 may, for example, be six clock cycles.

The shift circuit $400_2$ outputs the signal Nd3a, delayed from the output Nd2 of the shift circuit 400, a preset number of cycles, such as one clock cycle, of the clock Ck3 delayed by 90 degrees from Ck2, at the output n2. The shift circuit $400_2$ also outputs, from the terminal q, the signal Nd3 delayed from Nd2 a preset number of cycles, such as six clock cycles, of the clock Ck3.

The signal Nd3a is a signal delayed from Nd1 by 7.5 clock cycles from the rising edge of the clock Ck1. The NAND gate 502 NANDs the signal Nd1 and the signal Nd3a delayed from Nd1 by 7.5 clock cycles in terms of the clock Ck1, and outputs the result of the NAND operation as a 7.5-divided frequency division clock to a terminal N75.

The shift circuit $400_3$ outputs, from its terminal q, the signal Nd4 delayed from the output Nd3 of the shift circuit $400_2$ a preset number of clock cycles, such as 6 clock cycles, in terms of the clock Ck4. The shift circuits $400_1$ to $400_3$ are of the same configuration.

In FIG. 9, the 6.25-divided frequency division output N625 is given by the following logical expression:

$$N625 = NOR(NAND(Nd1,Nd2),NAND(Nd3,Nd4)) = AND(Nd1,Nd2,Nd3,Nd4) \qquad (6)$$

Figure 10:
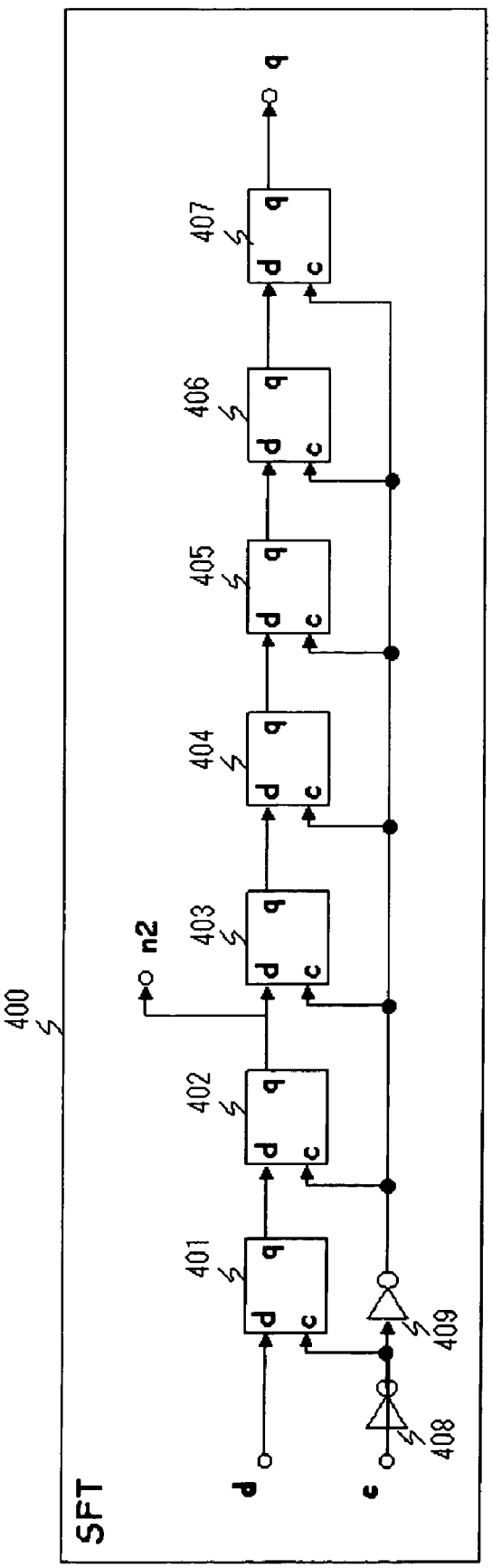
FIG. 10 is a diagram showing an illustrative configuration of the shift circuit of FIG. 9.

FIG. 10 shows an illustrative configuration of each of the shift circuits $400_1$ to $400_3$. Referring to FIG. 10, the shift circuit includes seven stages of flip-flops FFs 401 to 407, interconnected in cascades. The initial stage FF 401 is responsive to the rising edge of a clock signal inverted from the input clock signal c by the inverter 408 to sample and output a signal at the data input terminal d. The above rising edge occurs at a timing delayed by 180 degrees from the clock signal c. That is, at the initial stage FF 401, the data is sampled not at the beginning but in the vicinity of the center of a clock cycle, viz. at a timing delayed by 180 degrees, in order to sample the data in a stabilized state in consideration of, for example, the setup time.

The second or following stages of the FFs 402 to 407 are responsive to the rising edge of the clock signal c to sample the outputs of the respective previous stage FFs 401 to 406. From the data output terminal q of the second stage FF 402, n2 is taken out. The signal delivered to the data input terminal d is sampled by the FF 401 at a timing delayed by 180 degrees from the rising edge of the clock signal c, and the so sampled signal is sampled by the FF 402 responsive to the rising edge of the next clock cycle so as to be output as the signal n2. The signal delivered to the data input terminal d of the FF 401 and delayed by one clock cycle of the clock signal c is output at the terminal n2. The FF 407 outputs the signal delivered to the data input terminal d of FF 401 and delayed by six clock cycles in terms of the clock signal c.

FIG. 11 shows the operation of the operation of FIG. 9. With S67=1 and S78=0, a 6.25-divided frequency division clock, which is spurious-free, is output from N62.5.

With S67=0 and S78=1, a 7.5-divided frequency division clock, which is spurious-free, is output from N75.

Figure 12:
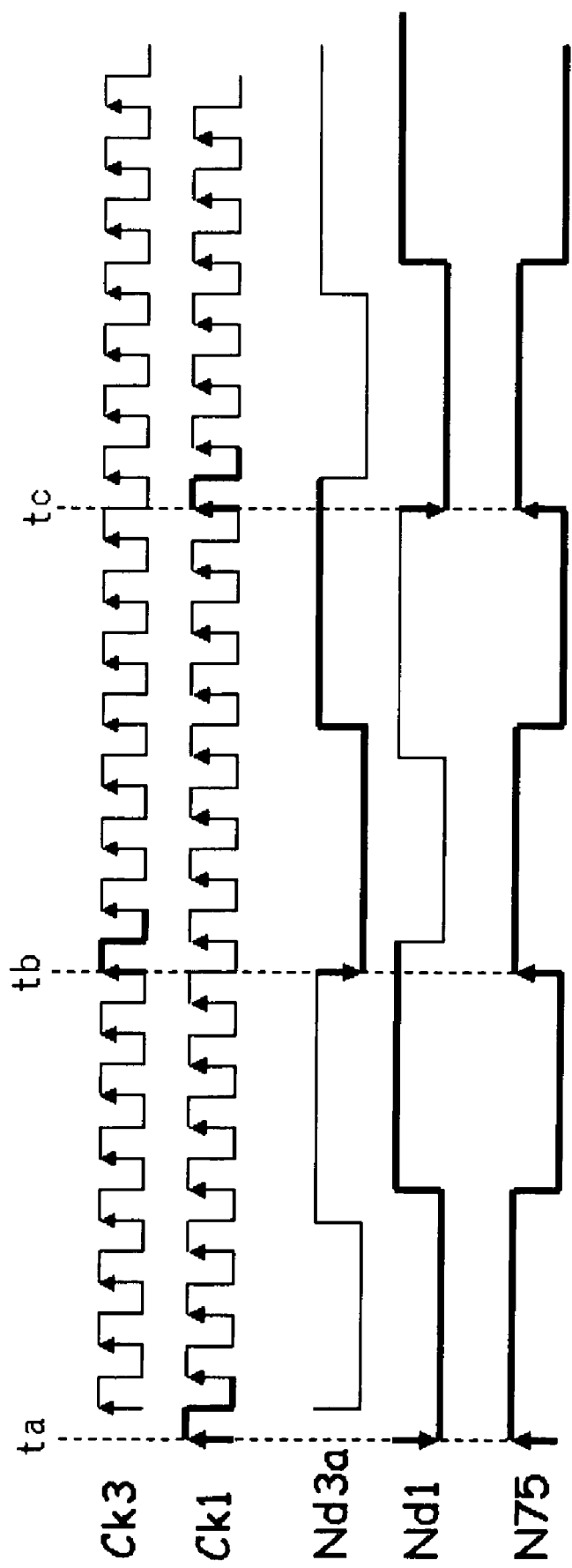
FIG. 12 is a waveform diagram showing timing waveforms of a mode div-7.5 of FIG. 9.

FIG. 12 depicts a timing diagram showing timing waveforms of Ck3, Ck1, Nd3a, Nd1 and N75 at the time of the divide-by-7.5 frequency division operation in FIG. 9 (S67=0, S78=1). Ck3 is a reverse-phased clock of Ck1. The output Nd1 of the frequency divider circuit (DIV678) 100 of the circuit (DIVC) 300, driven by the clock signal Ck1, outputs an 8-divided frequency division waveform (00001111) during an eight cycle period of the clock signal Ck1 from the rising timing ta of the clock signal Ck1. The output Nd1 then outputs a seven-divided frequency division waveform (0001111). That is, the timing from the timing ta until a time of the rising edge of Ck1 which is a half clock cycle from the rising timing tb of the clock signal Ck3 represents an 8-divided frequency division waveform outputting period. The output Nd1 then outputs a seven-divided frequency division waveform (0001111) until the timing tc. In FIG. 12, the time interval between timings ta and tb and that between timings tb and tc are both 7.5 clock cycles.

The shift circuit 400, delays Nd1 by six clock cycles, in terms of the clock signal Ck2, which is delayed by 90 degrees from the clock signal Ck1. The shift circuit $400_2$ receives the output Nd2 of the shift circuit 400, to delay the signal Nd2 by one clock cycle of the clock signal Ck3 to generate the signal Nd3a. Thus, the timing tb represents the timing of switching to the eight-divided frequency division waveform from the seven-divided frequency division waveform of Nd3a. The eight-divided frequency division waveform (00001111) from the timing tb of Nd3a corresponds to the eight-divided frequency division signal (00001111) from the timing ta of Nd1 delayed by six clock cycles of the clock Ck2 and by one clock cycle of the clock signal Ck3. The NAND output N75 of Nd1 and Nd3a transitions from 0 to 1 at the timing tb.

The output Nd1 of the frequency divider circuit (DIV678) 100 switches from the seven-divided frequency division waveform to the next eight-divided frequency division waveform at the timing tc. The signal Nd3a is 1 at timing tc, while being 1 during the half cycle until the next rising edge of the clock signal Ck3. The NAND output N75 of the signals Nd1 and Nd3a transitions from 0 to 1 at the timing tc.

Referring to FIG. 12, the signal N75 transitions from 0 to 1 at the rising timing ta of the clock signal Ck1 to remain at 1 during the four cycles from the timing ta. The signal is then 0 during the next following 3.5 clock cycles to output a 7.5-divided frequency division waveform. At the rising timing tb of the clock signal Ck3, the signal N75 transitions from 0 to 1 to remain at 1 during the four consecutive cycles from the timing tb to then become 0 during the next following 3.5 clock cycles. At the rising timing tc of the clock signal Ck1, the signal N75 transitions from 0 to 1 to output a 7.5-divided frequency division waveform. That is, the terminal N75 outputs the 7.5-divided frequency division waveform, prescribed by 7.5 cycles from the timing ta (rising edge of the clock signal Ck1) until the timing tb of the 7.5th clock from ta (rising edge of Ck3, hence the falling edge of Ck1), and the 7.5-divided frequency division waveform, prescribed by 7.5 cycles from the timing tb until the timing tc at the 7.5th clock from tb (rising edge of Ck1) without interruptions. Stated differently, the terminal N75 outputs only the clock signal of the frequency component corresponding to divide-by-7.5 frequency division of Ck1 to yield a spurious-free 7.5-divided clock signal.

Figure 13:
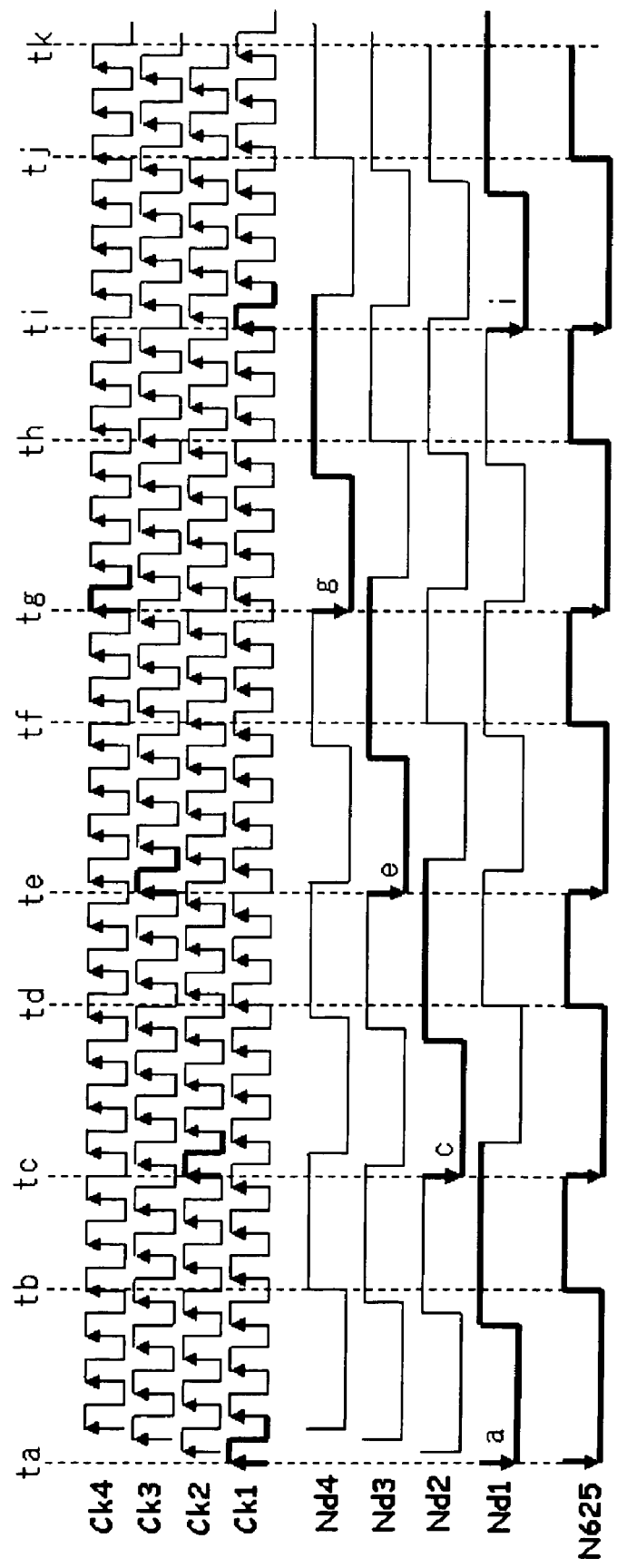
FIG. 13 is a waveform diagram showing timing waveforms of a mode div-6.25 of FIG. 9.

FIG. 13 depicts timing waveforms of Ck4, Ck3, Ck2, Ck1, Nd4, Nd3, Nd2, Nd1 and N625 at the time of the operation for frequency division with the frequency division number of 6.25 (S67=1, S78=0). The output Nd1 of the frequency divider circuit (DIV678) 100 of the circuit (DIVC) 300, driven by the clock signal Ck1, outputs a repetition of one divide-by-seven frequency division (0001111) followed by three consecutive divide-by-six frequency division waveforms (000111) time-divisionally.

Nd2 is a signal corresponding to Nd1 delayed by six cycle periods of the clock signal Ck2 which is delayed 90 degrees from Ck1. For example, the falling from 1 to 0 of Nd1 at the timing ta of the rising edge of the clock signal Ck1 (see the falling edge a of Nd1) is output to Nd2 at a timing tc of the seventh rising edge of the clock signal Ck2, hence at a timing delayed by six cycle periods of Ck2 (see the falling edge c of Nd2).

Nd3 is a signal corresponding to Nd2 delayed by six cycle periods of Ck3 which is delayed by 180 degrees from Ck1. For example, the falling edge from 1 to 0 of Nd2 at the timing tc of the rising edge of the clock signal Ck2 (see the falling edge c of Nd2) is output to Nd3 at a timing te of the seventh rising edge of the clock signal Ck3 as counted from the timing tc (see the falling edge e of Nd3).

Nd4 is a signal corresponding to Nd3 delayed by six cycle periods of Ck4 which is delayed by 270 degrees from Ck1. For example, the falling from 1 to 0 of Nd3 at the timing te of the rising edge of the clock signal Ck3 (see the falling edge e of Nd2) is output to Nd3 at a timing tg of the seventh rising edge of the clock signal Ck4 as counted from the timing te (see falling edge g of Nd3).

Nd625 is 1 if the signals Nd1, Nd2, Nd3 and Nd4 are all 1, while being 0 if otherwise. Nd625 is 0 for 3.75 clock cycles from the rise of Ck1 at the timing ta until rise of Ck4 at the timing tb, while also being 0 for 2.5 clock cycles from timing tb until timing tc. That is, 3.75 clock cycles+2.5 clock cycles=6.25 clock cycles, so that a 6.25-divided frequency division clock signal is output without interruptions. Stated differently, N625 outputs only a clock signal of a frequency component resulting from divide-y-6.25 frequency division of Ck1 to yield a spurious-free 6.25-divided frequency division clock signal.

The frequency division circuit (DIVC) 300 of FIGS. 3 and 5 and the frequency division circuit (DIVN) of FIG. 9 are featured by self-restoration (being reset-free). Whether or not the operation of a given circuit is the self-restoration operation may be confirmed by presupposing the circuit states for the totality of FFs and by confirming whether or not the operation reverts to a normal loop state for any of these states.

Figure 14:
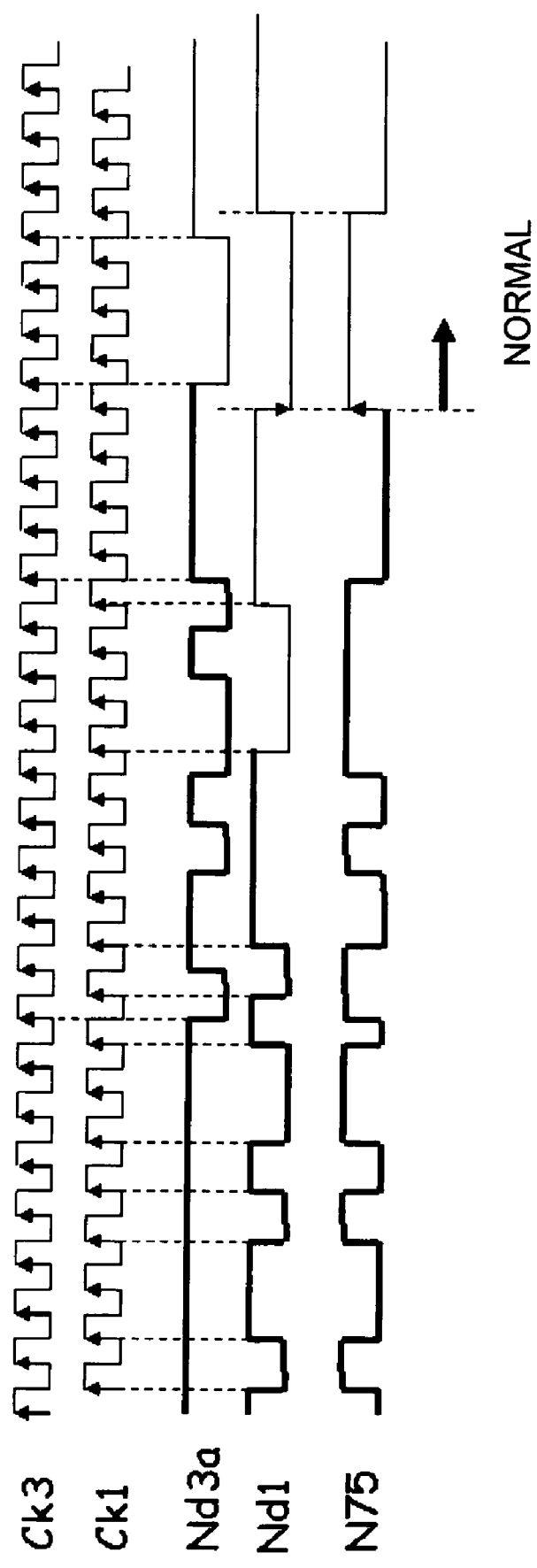
FIG. 14 is a waveform diagram showing timing waveforms of self-restoration.
Figure 15:
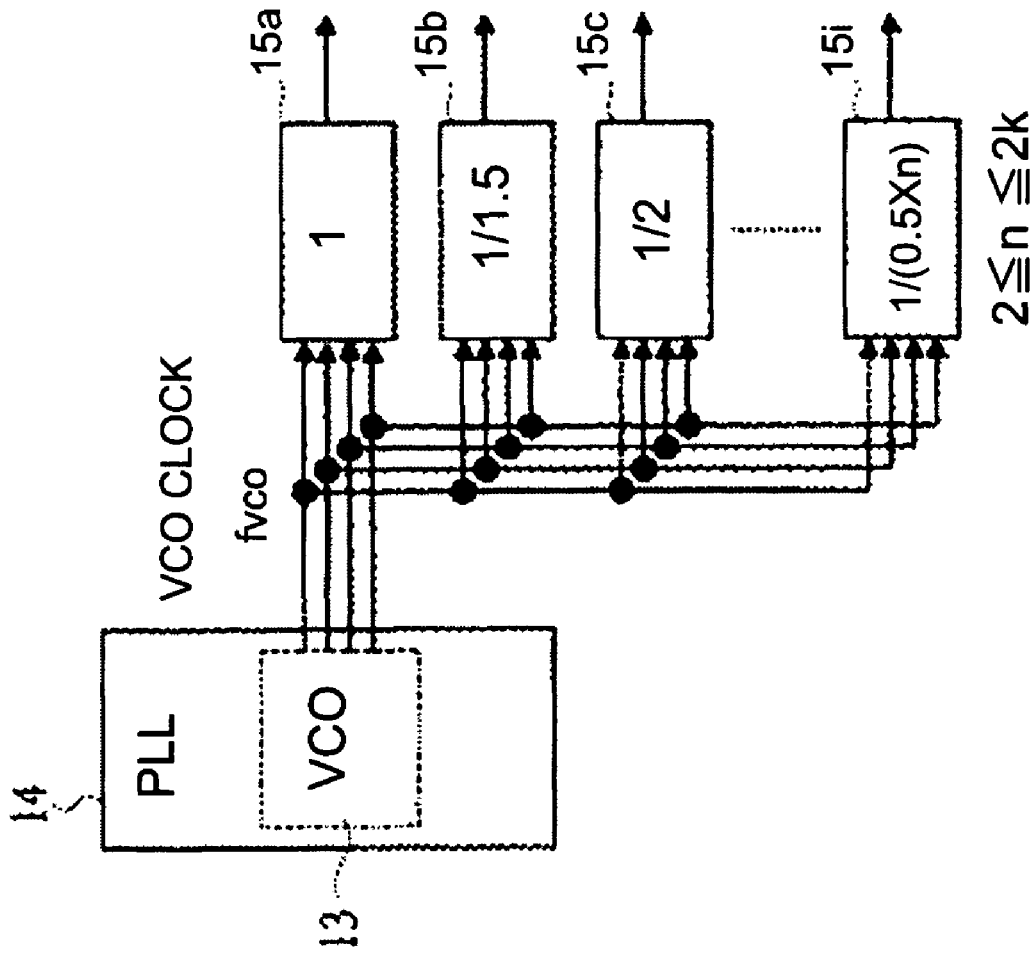
FIG. 15 is a diagram showing a configuration of a frequency divider circuit disclosed in patent publication 1.
Figure 16:
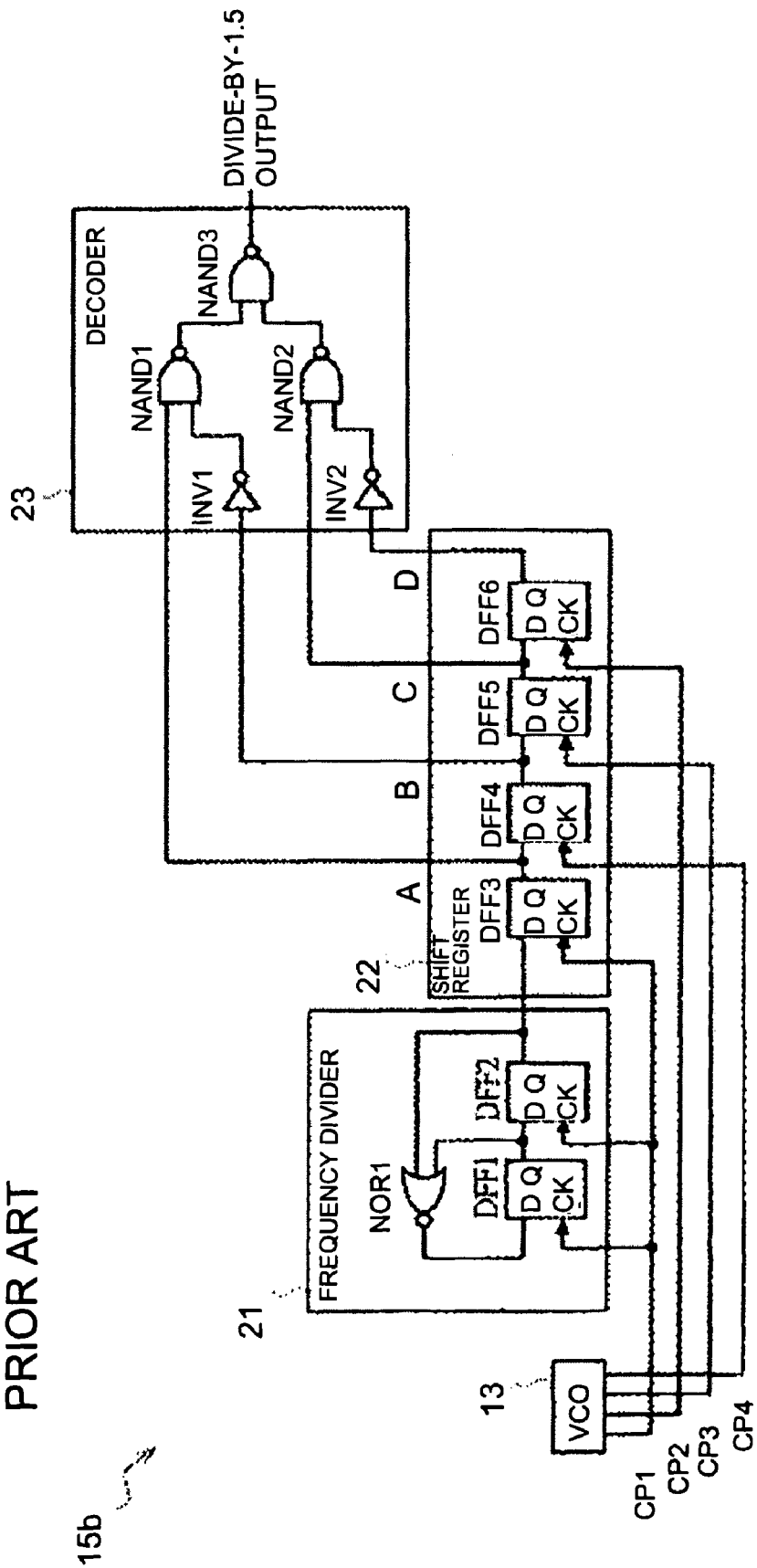
FIG. 16 is a diagram showing a configuration of a divide-by-1.5 frequency divider circuit disclosed in patent publication 1.

For example, FIG. 14 shows a waveform in the frequency division circuit (DIVN) of FIG. 9 at the time of restoration from the abnormal state to the normal state. Specifically, FIG. 14 shows various waveforms for the divide-by-7.5 frequency division mode, that is, in case S67 and S78 are fixed at 1, and in case the nodes [Na, Nb, Nc, Nd, Ne, NS1, NS2, NS3] commence from [1, 1, 0, 0, 0, 0, 0, 1]. In this case, the FFs in the shift circuits (SFs) $400_1$ to $400_3$ of FIG. 9 (see FIG. 10) revert to the normal mode all in the like manner. It is because only the value at the node Nd1 is shifted through the FFs without regard to the states of the FFs. That is, there is no necessity of providing a terminal for resetting the indefinite state to the known state.

The operation and effect of the present invention will now be described.

In the present Example, the divide-by-six, divide-by-seven and divide-by-eight frequency division circuits, as core circuits, are constituted by five FFs and a few logic circuits. The number of components is small to reduce the circuit area and power dissipation.

The indefinite states can be reduced by reducing the number of the core frequency division circuits to enable self restoration. The self-restoration, that is, reset-free divide-by-six, divide-by-seven and divide-by-eight frequency division switching circuit may be implemented without providing additional circuits. It is thus possible to implement a divide-by-6.25 circuit or a divide-by-7.5 frequency divider circuit using a simplified switching circuit.

In addition, spurious-free divide-by-6.25 or divide-by-7.5 frequency divider circuit may be implemented using multi-phase (four-phase) circuit. In any case, the number of components is small, so that self-restoration, that is, reset-free, frequency divider circuits may be implemented with a small circuit size and low power dissipation.

In the above Examples, the divide-by-6.25 frequency divider circuit and the divide-by-7.5 frequency divider circuit are described as a frequency divider circuit in which the frequency division number is a fractional number. It is however also possible to divide the frequency of the divide-by-6.25 frequency divider circuit by two in order to provide a divide-by-12.5 frequency divider circuit. It is also possible to time-divisionally continue the divide-by-6 frequency division operation by p times and the divide-by-7 frequency division operation by q times and to switch between the two operations in order to yield an optional frequency division number between 6 and 7. The same may be the of the divide-by-7 frequency divider circuit or the divide-by-8 frequency divider circuit.

The disclosures of the aforementioned Patent Documents 1 to 3 are incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

What is claimed is:

1. A frequency divider comprising:
   first to fifth flip-flops, each of the first to fifth flip-flops receiving a common clock signal, each of the first to fifth flip-flops sampling and outputting an input signal in response to a predetermined edge (termed an effective edge) of a rising edge and a falling edge of the clock signal, an output signal of the first flip-flop being supplied to an input of the second flip-flop;
   a first logic gate receiving an output signal of the second flip-flop and a first control signal as inputs, the first logic gate outputting the output signal of the second flip-flop when the first control signal is of a first value and outputting a predetermined value when the first control signal is of a second value, an output signal of the first logic gate being supplied to an input of the third flip-flop;
   a second logic gate receiving the output signal of the first flip-flop and a second control signal as inputs, the second logic gate outputting the output signal of the first flip-flop when the second control signal is of the first value and outputting a predetermined value when the second control signal is of the second value, an output signal of the second logic gate being supplied to an input of the fourth flip-flop; and
   a third logic gate receiving an output signal of the third flip-flop and an output signal of the fourth flip-flop as inputs, the third logic gate outputting an output signal of a first value when both inputs thereof are of a second value, an output signal of the third logic gate being supplied to an input of the fifth flip-flop, an output signal of the fifth flip-flop being fed back to an input of the first flip-flop.

2. The frequency divider according to claim 1, wherein an eight-divided frequency division signal is produced from an output of the fifth flip-flop when the first control signal is of the first value and the second control signal is of the second value;
   a seven-divided frequency division signal is produced from the output of the fifth flip-flop when the first control signal is of the first value and the second control signal is of the first value; and
   a six-divided frequency division signal is produced from the output of the fifth flip-flop when the first control signal is of the second value and the second control signal is of the first value.

3. A frequency divider circuit comprising:
   the frequency divider as set forth in claim 1, the output signal or an inverted output signal of the fifth flip-flop being used as a frequency divided output signal; and
   a switching circuit receiving third and fourth control signals which are for setting a frequency division number, the switching circuit also receiving the output signal of the fifth flip-flop and an inverted signal of the output of the third flip-flop as the first and second timing signals, respectively,
   the switching circuit generating the first and second control signals based on the first and second timing signals and the third and fourth control signals to deliver the generated first and second control signals to the frequency divider.

4. The frequency divider circuit according to claim 3, wherein the switching circuit generates a signal, the frequency of which is divided from the first timing signal with a frequency division number of four, when the third and fourth control signals are of the first and second values, respectively, the switching circuit generating a signal, the frequency of which is divided from the second timing signal with a frequency division number of two when the third and fourth control signals are of the second and first values, respectively,
   6-divided frequency division signals and a 7-divided frequency division signal being time-divisionally output from the fifth flip-flop at a rate of three 6-divided frequency division signals and one 7-divided frequency division signal to produce a 6.25-divided frequency division signal on an average, when the third and fourth signals are of the first and second values, respectively, and
   a 7-divided frequency division signal and an 8-divided frequency division signal being time-divisionally output from the fifth flip-flop at a rate of one 7-divided frequency division signal and one 8-divided frequency division signal to produce a 7.5-divided frequency division signal on an average, when the third and fourth signals are of the second and first values, respectively.

5. The frequency divider circuit according to claim 3, wherein the switching circuit includes:
   sixth and seventh flip-flops receiving the first timing signal in common as clock inputs, the sixth and seventh flip-flops each sampling an input thereof responsive to an effective edge of the clock input to output the sampled signal,
   the seventh flip-flop receiving an output signal of the sixth flip-flop as an input,
   an inverted signal of an output of the seventh flip-flop being fed back to an input of the sixth flip-flop;
   a fourth logic gate receiving outputs of the sixth and seventh flip-flops as two inputs, the fourth logic gate outputting the second value when the two inputs received are both of the first value;
   a fifth logic gate receiving the third control signal and an output signal of the fourth logic gate as two inputs, the fifth logic gate outputting the second value when both of the two inputs received are of the first value,
   an output signal of the fifth logic gate being the first control signal;
   an eighth flip-flop receiving the second timing signal as a clock input, the eighth flip-flop sampling an inverted signal of the output thereof responsive to an effective edge of the clock input; and
   a sixth logic gate receiving the fourth control signal and an output signal of the eighth flip-flop as two inputs, the sixth logic gate outputting the second value when both of the two inputs received are of the first value.

6. The frequency divider circuit according to claim 3, wherein a first phase clock, a second phase clock, a third phase clock and a fourth phase clock are received as inputs,
the first to fifth flip-flops receiving the first phase clock as inputs,
an inverted signal of an output of the fifth flip-flop being a first output signal;
the frequency divider circuit further comprising:
a first shift circuit receiving the second phase clock as an input clock, the first shift circuit outputting a second output signal delayed from the first output signal by a first number of clock cycles of the second phase clock;
a second shift circuit receiving the third phase clock as an input clock, the second shift circuit outputting a third output signal delayed from the second output signal by a second number of clock cycles of the third phase clock and a fourth output signal delayed from the second output signal by a first number of clock cycles of the third phase clock;
a third shift circuit receiving the fourth phase clock as an input clock, the third shift circuit outputting a fifth output signal delayed from the fourth output signal by the first number of clock cycles of the fourth phase clock;
a logic circuit receiving the first, second, fourth and fifth output signals, the logic circuit outputting a result of a logical operation on the first, second, fourth and fifth output signals as a 6.25-divided frequency division signal; and
another logic circuit receiving the first and third output signals, the another logic circuit outputting a result of a logical operation on the first and third output signals as a 7.5-divided frequency division signal.

7. The frequency divider circuit according to claim 6, wherein each of the first to third shift circuits includes an initial stage flip-flop that samples a received signal responsive to an effective edge of an inverted signal of the input clock to output a sampled signal; and
a plurality of stages of flip-flops, each of which samples an output of each previous stage flip-flop responsive to an effective edge of the input clock.

8. The frequency divider circuit according to claim 6, wherein the first number of clock cycles is 6 clock cycles, and wherein the second number of clock cycles is one clock cycle.

9. A frequency divider circuit comprising:
first to fifth flip-flops, each of the first to fifth flip-flops receiving a clock signal in common, each of the first to fifth flip-flops sampling and outputting an input signal in response to a predetermined edge (termed an effective edge) of a rising edge and a falling edge of the clock signal, an output signal of the first flip-flop being supplied to an input of the second flip-flop;
a first logic gate receiving an output signal of the second flip-flop and a first control signal as inputs, the first logic gate outputting the output signal of the second flip-flop when the first control signal is of a first value and outputting a predetermined value when the first control signal is of a second value, an output signal of the first logic gate being supplied to an input of the third flip-flop;
a second logic gate receiving the output signal of the first flip-flop and a second control signal as inputs, the second logic gate outputting the output signal of the first flip-flop when the second control signal is of the first value and outputting a predetermined value when the second control signal is of the second value, an output signal of the second logic gate being supplied to an input of the fourth flip-flop; and
a third logic gate receiving an output signal of the third flip-flop and an output signal of the fourth flip-flop as inputs, the third logic gate outputting an output signal of a first value, when both inputs received are of a second value,
the output signal of the third logic gate being supplied to an input of the fifth flip-flop, an output signal of the fifth flip-flop being fed back to an input of the first flip-flop, wherein
an eight-divided frequency division signal is produced from the output of the fifth flip-flop when the first control signal is of the first value and the second control signal is of the second value;
a seven-divided frequency division signal is produced from the output of the fifth flip-flop when the first control signal is of the first value and the second control signal is of the first value; and
a six-divided frequency division signal is produced from the output of the fifth flip-flop when the first control signal is of the second value and the second control signal is of the first value, and wherein
the frequency divider circuit further comprises:
sixth and seventh flip-flops both receiving the output signal of the fifth flip-flop in common as clock inputs, the sixth and seventh flip-flops each sampling an input responsive to an effective edge of the clock input to output the sampled signal;
the seventh flip-flop receiving an output signal of the sixth flip-flop, an inverted signal of an output of the seventh flip-flop being fed back to an input of the sixth flip-flop;
a fourth logic gate receiving outputs of the sixth and seventh flip-flops as two inputs, the fourth logic gate outputting the second value when the two inputs received are both of the first value;
a fifth logic gate receiving a third control signal and an output signal of the fourth logic gate as two inputs, the fifth logic gate outputting the second value when the two inputs received are both of the first value, an output signal of the fifth logic gate being the first control signal;
an eighth flip-flop receiving the output of the third flip-flop as a clock input, the eighth flip-flop sampling an inverted signal of an output thereof responsive to an effective edge of the clock input; and
a sixth logic gate receiving a fourth control signal and an output signal of the eighth flip-flop as two inputs, the sixth logic gate outputting the second value, when the two inputs received are both of the first value,
6-divided frequency division signals and a 7-divided frequency division signal being time-divisionally output from the fifth flip-flop at a rate of three 6-divided frequency division signals and one 7-divided frequency division signal to produce a 6.25-divided frequency division signal on an average when the third and fourth signals are of the first and second values, respectively, and
a 7-divided frequency division signal and an 8-divided frequency division signal being time-divisionally output from the fifth flip-flop at a rate of one 7-divided frequency division signal and one 8-divided frequency division signal to produce a 7.5-divided frequency division signal on an average when the third and fourth signals are of the second and first values, respectively.

10. The frequency divider circuit according to claim 9, wherein a first phase clock, a second phase clock, a third phase clock and a fourth phase clock are received as inputs;

the first to fifth flip-flops receiving the first phase clock as input; an inverted signal of an output signal of the fifth flip-flop being a first output signal, the frequency divider circuit further comprising:

a first shift circuit receiving the second phase clock as an input clock, the first shift circuit outputting a second output signal delayed from the first output signal by six clock cycles of the second phase clock;

a second shift circuit receiving the third phase clock as an input clock, the second shift circuit outputting a third output signal delayed from the second output signal by one clock cycle of the third phase clock and outputting a fourth output signal delayed from the second output signal by six clock cycles of the third phase clock;

a third shift circuit receiving the fourth phase clock as an input clock, the third shift circuit outputting a fifth output signal delayed from the fourth phase clock by six clock cycles of the fourth phase clock;

a first logic circuit receiving the first and second output signals, the first logic circuit outputting a result of a logical operation on the first and second output signals;

a second logic circuit receiving the fourth and fifth output signals, the second logic circuit outputting a result of a logical operation on the fourth and fifth output signals;

a third logic circuit receiving output signals of the first and second logic circuits, the third logic circuit outputting a result of a logical operation on the output signals of the first and second logic circuits as a 6.25-divided frequency division signal; and a fourth logic circuit receiving the first and third output signals, the fourth logic circuit outputting a result of a logical operation on the first and third output signals as a 7.5-divided frequency division signal.

11. The frequency divider circuit according to claim 10, wherein each of the first to third shift circuits includes an initial stage flip-flop sampling a received signal responsive to an effective edge of an inverted signal of the input clock to output a sampled signal; and sixth-stages of flip-flops, each of the flip-flops sampling an output of each previous stage flip-flop responsive to the effective edge of the input clock.

12. A semiconductor device comprising a frequency divider as set forth in claim 1.

* * * * *